(12) United States Patent
Lueng

(10) Patent No.: US 8,320,190 B2
(45) Date of Patent: Nov. 27, 2012

(54) METHOD AND APPARATUS OF OPERATING A NON-VOLATILE DRAM

(75) Inventor: Wingyu Lueng, Saratoga, CA (US)

(73) Assignee: Chip Memory Technology, Inc., San Jose, CA (US)

( * ) Notice: Subject to any disclaimer, the term of this patent is extended or adjusted under 35 U.S.C. 154(b) by 0 days.

(21) Appl. No.: 13/317,115

(22) Filed: Oct. 11, 2011

(65) Prior Publication Data
US 2012/0026794 A1  Feb. 2, 2012

Related U.S. Application Data

(62) Division of application No. 12/316,436, filed on Dec. 12, 2008, now Pat. No. 8,059,471.

(60) Provisional application No. 61/065,446, filed on Feb. 12, 2008.

(51) Int. Cl.
*G11C 11/34* (2006.01)

(52) U.S. Cl. .............. 365/185.25; 365/222; 365/185.21; 365/196

(58) Field of Classification Search ............. 365/185.25, 365/222, 185.21, 196
See application file for complete search history.

(56) References Cited

U.S. PATENT DOCUMENTS

| | | | |
|---|---|---|---|
| 5,153,853 A | 10/1992 | Eby et al. | |
| 5,181,188 A | 1/1993 | Yamauchi et al. | |
| 5,331,188 A | 7/1994 | Acovic et al. | |
| 5,973,344 A | 10/1999 | Ma et al. | |
| 6,754,108 B2 | 6/2004 | Forbes | |
| 6,798,008 B2 | 9/2004 | Choi | |
| 6,924,522 B2 | 8/2005 | Ma et al. | |
| 6,996,007 B2 | 2/2006 | Ahn et al. | |
| 7,099,181 B2 | 8/2006 | Ahn et al. | |
| 2006/0083068 A1* | 4/2006 | Ahn et al. | ............. 365/185.18 |
| 2006/0274580 A1 | 12/2006 | Forbes | |

FOREIGN PATENT DOCUMENTS
EP  0 557 581  9/1993

OTHER PUBLICATIONS

"A New Architecture for the NVRAM—An EEPROM Backed-Up Dynamic RAM," by Yasushi Terada et al., IEEE Journal of Solid-State Circuits, vol. 23, No. 1, Feb. 1988, pp. 86-90.

(Continued)

*Primary Examiner* — Jason Lappas
(74) *Attorney, Agent, or Firm* — Saile Ackerman LLC; Stephen B. Ackerman; Billy Knowles

(57) ABSTRACT

A non-volatile DRAM cell includes a pass-gate transistor and a cell capacitor. A read operation of the non-volatile cell begins by negatively charging the cell capacitor. A cell capacitor of an associated dummy non-volatile DRAM cell is fully discharged. The pass-gate transistor is activated and if the pass-gate transistor is programmed it does not turn on and if it is erased, it turns on. Charge is shared on the complementary pair of precharged bit lines connected to the non-volatile DRAM cell and its associated Dummy non-volatile DRAM cell. A sense amplifier detects the difference in the data state stored in the pass-gate transistor. The program and erase of the non-volatile DRAM cell is accomplished by charge injection from the associated bit line of the non-volatile DRAM cell.

27 Claims, 10 Drawing Sheets

OTHER PUBLICATIONS

"An Experimental 256Mb Non-Volatile DRAM with Cell Plate Boosted Programming Technique," by J-H. Ahn et al., ISSCC 2004, Session 2, Non-Volatile Memory, 2.2, 2004 IEEE International Solid-State Circuits Conference.

"High Density 5 Volt-Only compatible Non-Volatile RAM Cell," by Daniel C. Guterman, United Technologies/MOSTEK, Carrollton, Texas 75006, 728—IEDM 82, 30.1, 5 pages.

"Challenges for the DRAM Cell Scaling to 40nm," by W. Mueller et al., 0-7903-9269-8/05, Copyright 2005 IEEE, 4 pages.

* cited by examiner

METHOD AND APPARATUS OF OPERATING A NON-VOLATILE DRAM

This application claims benefit under 35 U.S.C. §120 and 37 CFR §1.78 as a divisional application to U.S. patent application Ser. No. 12/316,436, filed Dec. 12, 2008 now U.S. Pat. No. 8,059,471, which in turn claims benefit under 35 U.S.C. §119 to U.S. Provisional Patent Application Ser. No. 61/065,446, filed on Feb. 12, 2008, both of which are herein incorporated by reference in their entirety.

BACKGROUND OF THE INVENTION

1. Field of the Invention

This invention relates generally to non-volatile dynamic random access memories (DRAM). More particularly, this invention relates to methods and circuits for operating non-volatile DRAM's.

2. Description of Related Art

Non-volatile memories, such as FLASH and Electrically Erasable Programmable Read-Only Memory (EEPROM), are commonly used for providing a more permanent storage. The data state of non-volatile memory cells are retained when the power supply voltage source is removed. In general, the non-volatile memories have smaller silicon foot-print and lower cost per bit than other semi-conductor memory.

The alternative to the non-volatile memories are volatile memories such as Static Random Access Memory (SRAM) and Dynamic Random Access Memory (DRAM). The volatile memories generally have a greater accessing speed. A DRAM has faster random access speed than a non-volatile memory, however, it cannot retain data without a periodic refresh process.

These different characteristics between the non-volatile memory and the volatile memory cause each type of memory to have different applications in computer systems. As a result, many types of systems include both non-volatile and volatile memories in the differing applications. Because the non-volatile and volatile memory have these different characteristics, interface and control of non-volatile and volatile are substantially different and resulting in more complicated system design. Therefore, it is desirable to have a memory device that offers fast random access of a volatile memory and the capability of permanently retaining data of a non-volatile memory with substantially the same cost of a DRAM.

A combination of a non-volatile memory and a volatile memory is known in the art as illustrated in "A New Architecture for the NVRAM—An EEPROM Backed-Up Dynamic RAM", JSSC vol. 23, 1988, pp. 86-90, Terada et al. It describes a nonvolatile DRAM with a cell formed by merging a three-transistor EEPROM cell with a one-transistor-one-capacitor DRAM cell. The resultant cell contains 4 transistors and 1 capacitor. Fowler-Nordheim tunneling is used to program and erase the EEPROM portion of the cell.

"An Experimental 256 Mb Non-Volatile DRAM with Cell Plate Boosted Programming Technique", Ahn et al.—ISSCC, Digest of Technical Papers IEEE International Solid-State Circuits Conference—2004, February, 2004, Vol. 1, pp.: 42-43 & 512-519 describes a one transistor and one capacitor cell. The transistor contains a SONOS (silicon-oxide-nitride-oxide-silicon) structure in the gate for non-volatile data retention. Hot-hole injection is used to inject holes to the traps in the gate dielectric and Fowler-Nordheim tunneling is used to remove the holes from the traps. In the non-volatile mode operations, the memory is erased and programmed in blocks and thus behaving like a Flash memory.

"High Density 5 Volt-Only Compatible Non-Volatile RAM Cell", Guterman, Technical Digest of International Electron Devices Meeting, IEEE, December, 1982, Vol.: 28, pp.: 728-732, teaches a nonvolatile DRAM cell formed by merging a 1T-1C DRAM cell with a non-volatile cell formed by a transistor with a floating poly gate and a control poly gate. The resultant cell consists of 4 transistors and 2 capacitors.

"Challenges for the DRAM Cell Scaling to 40 nm", Digest of IEDM, 2005, by W. Mueller et al., Technical Digest International IEEE Electron Devices Meeting, December 2005, pp.: 4 reviews the concepts, status and challenges for the DRAM scaling down to 40 nm. The technologies that are discussed are the DRAM cell capacitor structures and materials, as well as the cell transistor structures. The DRAM cell capacitor structures illustrated are the stacked capacitor and the trench capacitor.

U.S. Pat. No. 5,181,188 (Yamauchi et al.), presents a memory cell formed by merging a DRAM cell and an Electrically Eraseable Programmable Read Only Memory (EEPROM) cell. The cell consists of 3 transistors and 1 capacitor. One of the transistors is used to isolate the DRAM portion of the cell from the EEPROM portion of the cell during DRAM operation or EEPROM operation. The transistor is turned on, however, when data is transferred from the EEPROM portion to the DRAM portion.

U.S. Pat. No. 6,798,008 (Choi) describes a memory cell that includes a non-volatile device and a DRAM cell. The cell consists of two transistors and one capacitor. One of the transistors is the non-volatile transistor which has a split-gate structure.

European Patent EP0557581 (Acovic-581) and U.S. Pat. No. 5,331,188 (Acovic-188) are directed to a one-transistor-one-capacitor non-volatile DRAM cell having a two layer floating gate to allow the contents of a storage capacitor to be transferred to the floating gate during power interruptions. The first layer of the floating gate is separated from a storage node of the storage capacitor by a tunnel oxide to allow electron tunneling between the floating gate and the storage capacitor. In one implementation, a dual electron injector structure is disposed between a one layer floating gate and the storage node to allow electrons to be injected between the floating gate and the storage node. An erase gate is implemented to remove the charge on the floating gate. The erase gate can be separated from the floating gate by a tunnel oxide or a single electron injector structure to allow electrons to travel from the floating gate to the erase gate.

U.S. Pat. No. 5,153,853 (Eby, et al.) teaches a method and apparatus for measuring threshold voltages associated with the EEPROM portion of a non-volatile DRAM (NVDRAM) memory cell.

U.S. Pat. Nos. 5,973,344 and 6,924,522 (Ma) describe a floating gate transistor formed by simultaneously creating buried contact openings on both EEPROM transistor gates and DRAM access transistor source/drain diffusions. Conventional DRAM process steps are used to form cell storage capacitors in all the buried contact openings, including buried contact openings on EEPROM transistor gates. An EEPROM transistor gate and its associated cell storage capacitor bottom plate together forms a floating gate completely surrounded by insulating material. The top cell storage capacitor plate on an EEPROM transistor is used as a control gate to apply programming voltages to the EEPROM transistor. Reading, writing, and erasing the EEPROM element is analogous to conventional floating-gate tunneling oxide (FLOTOX) EEPROM devices. In this way, existing DRAM process steps are used to implement an EEPROM floating gate transistor nonvolatile memory element.

U.S. Pat. No. 6,754,108 and U.S. Patent Application 2006/0274580 (Forbes) teach DRAM cells with repressed floating gate memory with low tunnel barrier interpoly insulators. The memory cells have a volatile and a non-volatile component in a single memory cell. The memory cells include a first source/drain region and a second source/drain region separated by a channel region in a substrate. A storage capacitor is coupled to one of the first and the second source/drain regions. A floating gate opposes the channel region and is separated from the channel region by a gate oxide. A control gate opposes the floating gate. The control gate is separated from the floating gate by a low tunnel barrier intergate insulator. The memory cell is adapted to operate in a dynamic mode of operation and a repressed memory mode of operation.

U.S. Pat. No. 6,996,007 (Ahn et al.—007) describes a non-volatile DRAM cell that contains a floating transistor and a storage capacitor. The floating gate pass transistor includes a charge storage floating gate that serves as temporary data storage when the memory transits from the non-volatile mode to the DRAM mode. The transition goes through a recall and a normalization process. The recall/normalization process is similar to the recall/erase operation described in Acovic-188. During the normalization process, data stored in the floating gate of all the memory cells is erased. Like the memory described in Acovic-188, during programming, the data stored in the storage capacitors of the memory cells is transferred to the floating gates, accomplished by injecting hot electrons from the source of the floating transistor connecting to the storage capacitor. In this scheme, the hot-electron injection is carried out by driving the common capacitor plate from 0.0V to 2.5V. Since the common capacitor plate connects to the storage capacitors of the all the cells in the same memory array. The programming is carried out in memory pages.

U.S. Pat. No. 7,099,181 (Ahn, et al.—181) provides a method for operating a non-volatile dynamic random access memory (NVDRAM) device having a plurality of memory cells, each cell having a capacitor and a transistor incorporating a floating gate. The memory cell of the NVDRAM device includes a control gate, a floating gate, two insulating layers, a transistor and a storage capacitor. The capacitor has a plate node, connecting to the plate nodes of the capacitor of other cells in the same array. The capacitor plate is coupled to a plate line with controllable plate line voltage for injecting and removing charge from the floating gates of the memory cells.

SUMMARY OF THE INVENTION

An object of this invention is to provide a non-volatile DRAM cell which provides fast random access of a volatile memory cell and the capability of retaining data of a non-volatile memory. The cell is capable of going through program or erase without affecting the voltage on the common-plate of the cell capacitor or exceeding the maximum voltage across the cell capacitor in the DRAM mode. Preserving the maximum compliance voltage of the capacitor allows the cell to be fabricated using a DRAM process with changes limited to the gate structure of the pass-gate transistor. Another object is to provide a non-volatile DRAM device that consists of multiple rows and columns of the non-volatile DRAM cells such that the memory device can provide fast read and write access similar to that of a DRAM device but can retain data like a non-volatile memory device. Yet another object is to provide a sensing scheme so that the same sense amplifier can be used for both DRAM and NVM read operation. Another objective is to provide a method and apparatus on the non-volatile DRAM device so that, during a program or erase operation, the cell capacitor common-plate voltages is not changed; the data stored in the capacitor of the memory cells in the non-selected row is preserved, and the maximum voltage across the cell capacitors is substantially the same as that when the device is operating in the DRAM mode. The advantage of preserving data stored in the cells capacitors of non-selected rows minimizes the page size of the non-volatile memory program/erase operation to one memory row rather than the whole array as in other prior art schemes such as those described in U.S. Pat. No. 7,099,181 (Ahn, et al.) and U.S. Pat. No. 5,181,188 (Yamauchi et al). Since the memory is capable of row erase and program, the read and write tolerance of the memory as a whole, is better than those with array erase/program operation by a factor equal to the array size divided by row size. This is because, when a memory array is accessed, the chance that a bit in a memory block that needs to go through an erase/program cycle is row size/block size in the present embodiment.

Accordingly, a non-volatile DRAM memory cell, in the present embodiment, consists of a NMOS pass-gate transistor and a capacitor. A floating gate is incorporated in the pass-gate transistor. The drain of the transistor is connected to a bit line; the source is connected to the bottom-plate of the capacitor and a control gate is connected to a word line. The floating gate and the control gate are formed by two different layers of poly-silicon. Alternatively, the floating gate can be formed by a nitride layer. The pass-gate transistor is disposed in a P-type well. In one embodiment, the P-type well is disposed in a deep N-well and the deep N-well is disposed in a P-type substrate. Alternatively, the P-well is disposed directly in a P-type or N-type substrate. A metal-insulator-metal (MIM) capacitor is used in the cell. In an alternative embodiment, a trench capacitor can be used. The capacitor has two nodes or plates. The bottom plate is coupled to the source of the pass-gate transistor and the top plate is coupled to a common plate node. During operation, the P-well is coupled to a fixed voltage, for example ground or −1v. The common plate node is coupled to another fix voltage, for example a voltage equal to half of the power supply voltage (HVCC).

Since the non-volatile DRAM cell contains only two devices: the floating-gate pass transistor and the cell capacitor, it can have a size similar to that of a DRAM cell. Thus the non-volatile DRAM cell in this embodiment is substantially smaller than the non-volatile DRAM cells formed using multiple transistors, such as the one described in JSSC vol. 23, 1988, pp. 86-90 (Terada et al).

The non-volatile DRAM cell can store data in two separate areas: the capacitor and the floating gate. Data can be written to the capacitor much faster than to the floating gate. Read speed from the floating gate and the capacitor is similar. Data is stored in the floating gate in the form of trapped charges. The amount of negative charge in the floating gate is increased during a program operation and decreased during an erase operation. In the present embodiment, during a program operation, electrons are injected from the drain of the pass-gate transistor into the floating gate by means of Fowler-Nordheim tunneling mechanism. During an erase operation, holes tunnel from the drain to the floating gate by means of gate-induced-drain-lowering assisted band-to-band tunneling. In both operations, charges are injected into the floating gate through the drain region. This is different from the scheme described in U.S. Pat. No. 6,996,007 in which the source node connecting to the storage capacitor is used for charge injection, and in the scheme described in U.S. Pat. No. 6,754,108, in which charge is injected through the control or coupling gate. Charge injection through the drain of the pass-gate connecting to the bit line localizes the high voltages in the drain and control gate of the pass-gate transistor and protects the capacitor from the high voltages during the program and erase operation. Additionally, the plate voltages of the capacitor are not affected thereby preserving the data stored in capacitor of the cells in the neighboring rows. The amount of negative charge trapped in the floating gate affects the turn-on or threshold voltage of the pass-gate transistor. The larger the amount of negative charge, the higher is the threshold voltage of the pass-gate transistor. In the present embodiment, the pass-gate transistor has a threshold voltage of approximately 0.7 v and 2v when the floating gate is in the erased and programmed state respectively.

A non-volatile DRAM device formed by one or more array of the non-volatile DRAM cells provides external fast read and write access similar to that of a DRAM. The device also supports a store operation for storing data in the cell capacitors to the floating gate of the same cell. The store operation is usually executed before power down so that the written data can be retained after power is turned off.

In the memory array, all the cells in a row have their control gate connected to a word line. The cell array is arranged in a folded bit-line structure such that a complementary bit line pair is associated with a column of cells with half of the cells in the column connected to one bit line and the other half connected to the other bit line. The folded bit line arrangement is commonly used in the memory arrays of a DRAM device and is well documented in the DRAM art. In the present embodiment, the memory array incorporates at least one dummy row of non-volatile DRAM cells with their floating gate preconditioned in the erase state. The dummy row facilitates non-volatile memory read operations during which data stored in the floating gate of the non-volatile DRAM cells is accessed.

The non-volatile DRAM device includes a plurality of sense amplifiers for data sensing operations when data is read from the capacitor or the floating gate of the non-volatile DRAM cell. Data sensing in a normal DRAM and a Nonvolatile memory (NVM) is inherently different. Data sensing in a DRAM usually employs charge sensing because the data stored in a DRAM cell is represented by the amount of charge stored in the capacitor of the cell. However, data sensing in a NVM usually employs current sensing because data state represented by the amount of charge trapped in the floating gate is automatically converted into current conducted by the pass-gate transistor when the pass-gate is turned on. Due to the difference between charge and current, data sensing in a DRAM and nonvolatile memory is traditionally different. To reduce the semiconductor circuit area occupied by the sense amplifiers and simplify the sensing control logic, it is desirable to use the same sense amplifiers for both DRAM and NVM read operations. In the present embodiment a sensing scheme that can perform sensing operation for data stored in both the floating gate and the capacitor of the cell using the same sense amplifier is provided.

During a write transaction, write data is stored in the capacitors of the non-volatile DRAM cells. The operation is similar to that of a common DRAM with the word line of the row selected for access coupling to a voltage high enough to turn on the pass-gate transistors of the cells in the row. The pass-gate transistor thereby couples the capacitor of the cell to the bit line to which the pass-gate transistor is connected. Write data driven to the bit line is thus stored in the cell capacitor. In the present embodiment, the pass-gate transistors of the non-volatile DRAM cells have different threshold voltages depending on the data state stored in the floating gate. The pass-gate transistor with its floating gate in the program state has a higher threshold voltage of approximately 2v. To ensure that the pass-gate transistor in the erase state is turned on during a write access, the word line of the selected word line is driven to an over-drive voltage of approximately 2.5v. During a write access, data stored in the floating gate of the cells in the selected row is read and stored in the bit lines where it is merged with the write data. The merged data is then stored in the cell capacitors of the row. Even though the floating gates of the row still have a copy of data but the cell capacitors of the row have the most updated copy of the data. To ensure that the most updated data is accessed for subsequent memory operations, a tag register is incorporated. Each bit in the tag register is associated with a row. The tag bit has a state of '0' at power up. After a write operation, the tag bit of the accessed row is set to '1'. Data stored in the cell capacitors, requires periodic refresh. The tag bit conveniently provides the information on whether a row needs to be refreshed during a refresh operation. Only rows with its associated tag bit set to '1' needs to be refreshed.

Read access is handled as a DRAM read operation or by a NVM read operation depending on whether state of the tag bit associated with the row selected for access. If the tag bit has a state of '0' a NVM read operation is performed. If the tag bit has a state of '1', signaling the row has been modified, a DRAM read operation is performed. The same set of sense amplifiers handles both read operations. The DRAM read operation is similar to those commonly used in a DRAM device.

The NVM read operation, is facilitated by a row of dummy cells which provides the reference for the sensing. NVM Read access starts with the bottom plates of the cell capacitors of the row selected for access being pre-charged to 0v. Also, all the bit lines are pre-charged to a voltage level that is equal to one half of the power supply voltage HVCC. Then the word line of the row selected for access is coupled to the data delineation voltage of approximately 1.5v. For the cells that have their floating gates in the erased state, their pass-gate transistors are turned on as their threshold voltage is 1v or less. The negatively charged capacitors of the erase cells are thus coupled to the bit lines to which the cells are connected. The pass-gate of the programmed cells remains off as they have a threshold voltage higher than 2v. As a result, bit lines connected to the erased cells have a voltage level (Delta) below the pre-charge voltage (HVCC), for example HVCC-Delta. However, bit lines connected to the programmed cells have their voltage remaining substantially the same as the pre-charge voltage (HVCC). The complementary bit lines that are not connected to the cells in the selected row, provide voltage reference for the sensing operation. The differential voltage in each bit line pair is subsequently amplified by the sense amplifier resulting in the read data of '0' and '1' for the erase and program cell respectively.

The store operation is facilitated with a row address counter. During a store operation, write data stored in the capacitor of a non-volatile DRAM cell is transferred to the floating gate of the cell. In the non-volatile DRAM device, the write data transfer is carried out one row at a time. When the non-volatile DRAM device receives a store transaction, a row address counter is reset so that its output bits are all reset to '0' to indicate a first row (Row 0). Row 0, as selected by the rowaddress counter, goes through the store operation first. If the tag bit within a row tag register associated with row 0 has a value '1', a transfer operation is performed in Row 0. Otherwise, the transfer operation is skipped. Next, the address counter is incremented by 1 selecting Row 1 for operation. If the tag bit within the row tag register associated with row 1 has a value of '1', the transfer operation carried out in row 1. Otherwise, the transfer operation is skipped. Then the address counter is incremented by 1 selecting row 2 for the store operation. This process continues row-by-row until all the row addresses are traversed. The transfer operation is facilitated by a row data buffer. Data stored in the capacitor of the cells of the selected row is read and stored in the row buffer. Next, an program operation is performed on the cells in the selected row. After the program operation, an erase operation is performed on the cells with a data value of '1' Thus an erase operation is performed only to those cells in the row with the data to be stored equal to '1'.

DETAILED DESCRIPTION OF THE INVENTION

Figure 1:
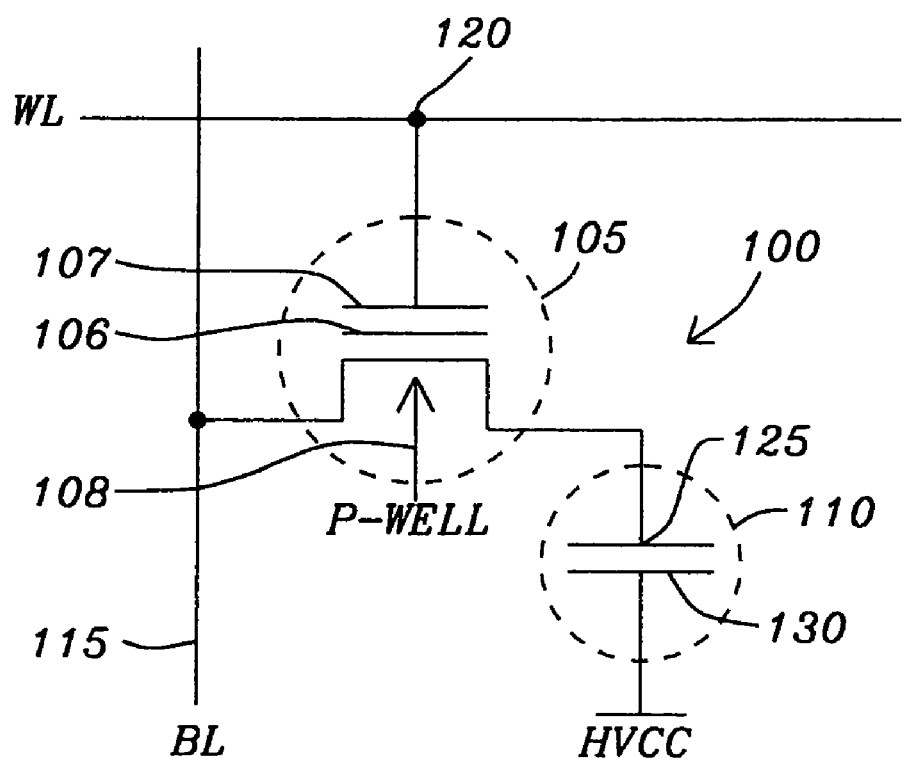
FIG. 1 is a schematic diagram of a non-volatile DRAM cell.

FIG. 1 shows the schematic of a non-volatile DRAM cell 100 in the present embodiment. It includes a pass-gate transistor 105 and a cell capacitor 110 to provide fast read or write access in the DRAM operating mode and in the NVM operating mode. The non-volatile DRAM cell 100 is arranged similar to a DRAM cell with the drain of the pass-gate transistor 105 connecting to a bit line 115, the source connecting to the bottom plate 125 of the cell capacitor 110 and the control gate connecting to a word line 120. The top capacitor plate 130 is connected to a common-plate node coupled to a voltage source HVCC with a voltage equal to one half of the voltage level of the power supply voltage. The pass-gate transistor 105 functions as the selection transistor and the cell capacitor 110 provides temporary charge storage when the non-volatile DRAM cell 100 is operating in the DRAM mode. The pass-gate transistor 105 contains a floating gate 106 and a control gate 107. The floating gate 106 is separated from a bulk channel region channel 108 by a tunneling insulator. The bulk 108 of the floating gate transistor is a P-type well which can be formed directly in a P-type substrate or in a deep N-type well disposed in a P-type substrate.

Figure 2:
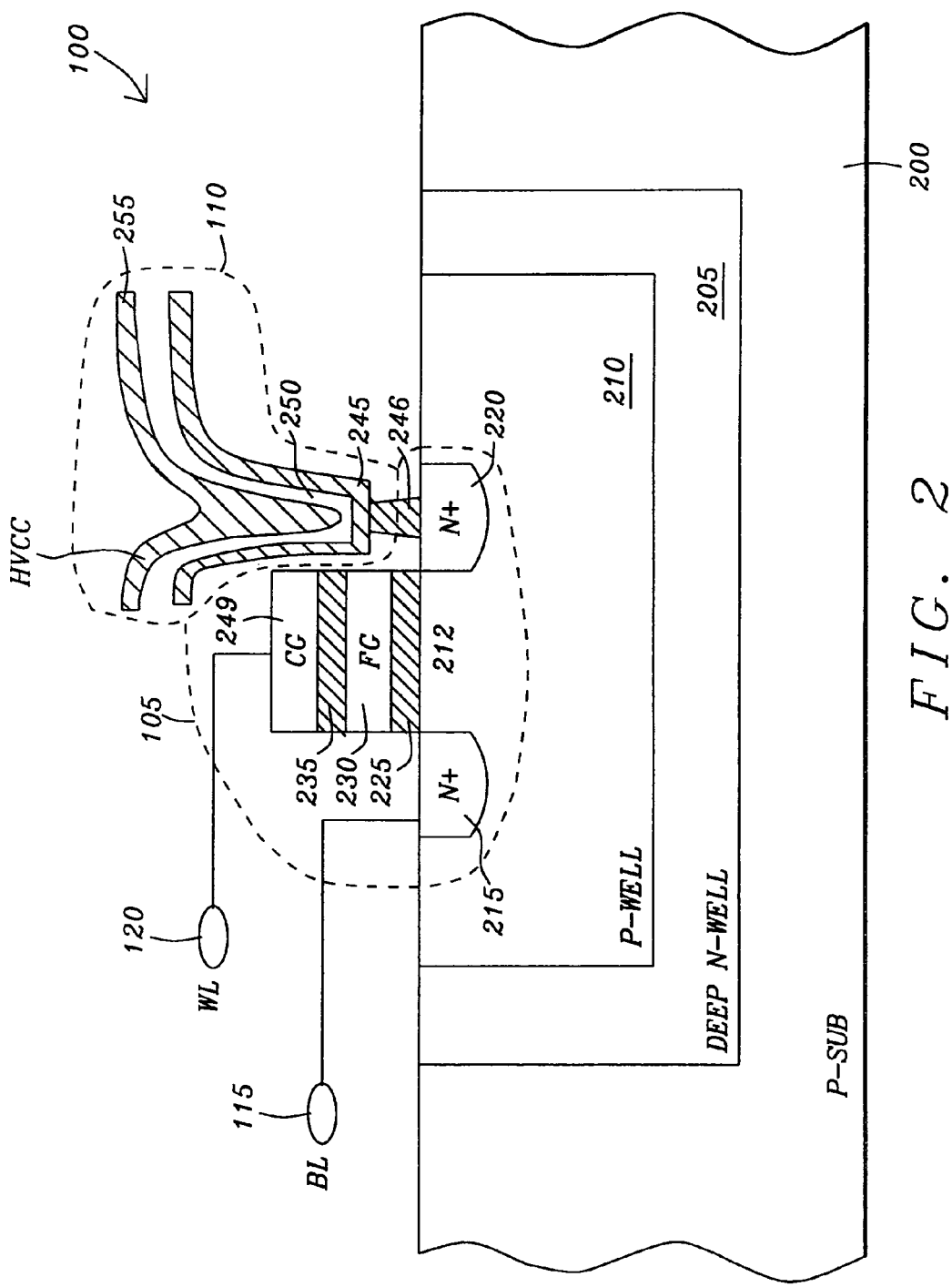
FIG. 2 is cross-sectional view of an embodiment of a non-volatile DRAM cell of this invention.

FIG. 2 shows a cross section of the non-volatile DRAM cell. In the present embodiment, a deep N-type well 205 is diffused into a top surface of a provided substrate 200 that is doped with a P-type impurity. A P-type well 210 is then diffused into the region of the deep N-type well 205. The P-type well 210 is shared by all the non-volatile DRAM cells of an array of non-volatile DRAM cells. Both the P-type substrate 200 and the deep N-well 205 are connected to a substrate biasing voltage source 260. The P-type well 210 is connected to a P-well biasing voltage source 270. In another embodiment, the P-type well 210 is diffused into the P-type substrate 200 directly and both the P-well 210 and the substrate 200 is connected to the substrate biasing voltage source 260.

The cell capacitor 110 in the present embodiment is a metal-insulator-metal (MIM) capacitor. The bottom metal layer forms the bottom-plate 245 of the cell capacitor 110 which is coupled to the source 220 through a metal contact 246. An inter-metal insulating layer 250 is formed on the bottom metal layer 245. The top plate 255 of the cell capacitor 110 is formed by another metal layer on the inter-metal insulating layer 250. The top plate 255 of the cell capacitor 110 is connected to the top plate of the cell capacitor of other cells and coupled to a common plate biasing voltage HVCC which has a level equal to one half of the voltage level of the power supply voltage source ($V_{CC}/2$). In the present embodiment, the cell capacitor 110 is shown as a stacked capacitor. In an alternative embodiment, the capacitor is a trench capacitor. The control gate 249 is formed by poly-silicon. The floating gate 235, in one embodiment is formed by poly-silicon, and in another embodiment, a nitride layer. The later one results in a silicon-oxide-nitride-oxide-silicon (SONOS) gate structure for the pass-gate transistor 105.

The non-volatile DRAM cell 100 can store two different pieces of data in two separate areas: a first datum is stored in the cell capacitor 110 and a second datum in the floating gate 230. The voltage stored in cell capacitor 110 determines the state of the data stored in the non-volatile DRAM cell 100. In the present embodiment, the top-plate 255 of the cell capacitor 110 is connected to a constant voltage equal to half of the power supply voltage (HVCC), therefore the voltage at the bottom plate 245 determines the data state. For example, a voltage greater than HVCC may designate a data value of '1' and a voltage smaller than HVCC may designate a '0'. The voltage in the cell capacitor 110 can be changed during a write operation. Voltage in the cell capacitor 110 decreases over time due to leakages. Periodic refresh operation is required to restore the voltage level in the cell capacitor.

The amount and the polarity of charge stored in floating gate 106 determine the state of the data stored in the floating gate. The charge in the floating gate 230 affects the turn-on or threshold voltage of the pass-gate transistor 105, the more negative charge amount, the higher threshold voltage. Data stored in the floating gate can be conveniently represented, for example, in '0' state when the threshold voltage is below a delineation voltage of 1.5v and in '1' state when the threshold voltage is above the delineation voltage. The data stored in the floating gate can be different from the data stored in the cell capacitor 110 at any time. The amount of electrons in the floating gate 230 is increased during a program operation and decreased during an erase operation. Electrons stored in the floating-gate 230 can be retained over many years even with the power turned off.

In the present embodiment, the P-well 210, deep N-well 205 and the substrate 200 of the non-volatile DRAM cell 100 are coupled to ground or 0v for all memory operations. In an alternative embodiment, the P-well 210 is coupled to −1v while the deep N-well 205 and the substrate 200 is coupled to 0v. When programming the non-volatile DRAM cell 100, the control gate 249 is coupled to a voltage of about 10V and the bit line 115 is coupled to ground or 0v. A high electric field is thus created between the control gate 249 and the drain 215 of the pass-gate transistor 105 causing electrons to tunnel from the drain 215 to the floating gate 249 through the tunnel oxide 225. The direct tunneling of electrons through the tunnel oxide 225 is commonly called Fowler-Nordheim tunneling. To erase the cell, the control gate 249 is driven to approximately −5v and the drain 215 of the pass-gate transistor 105 is coupled to 5v. A high electric field is imposed on the junction between the drain 215 and bulk 212 underneath the floating gate 230 of pass-gate transistor 105 causing band-to-band tunneling to occur. Holes diffuse from the n+ drain 215 to the channel 212 where they are accelerated by the high vertical field between the control gate 249 and channel region 212. Some of the hot holes acquire sufficient velocity to tunnel through the tunnel oxide 225 and are trapped in floating gate 230. This mechanism of hot hole injection is commonly called gate-induced-drain-lowering (GIDL) assisted band-to-band tunneling. In both program and erase operations, the drain 215 of the floating-gate transistor 105 serves as charge injector. The arrangement beneficially localizes the high voltages to the drain 215 and control gate 249 of the pass-gate transistor 105. Thus the cell capacitor 110 is protected from the high voltages, preserving the process of forming the DRAM capacitor when the memory device is fabricated using a modified DRAM process. Moreover, the voltages on the plates 245 and 255 of the cell capacitor 110 are not affected during program and erase operations, thereby preserving the data stored in cell capacitors 110 in the neighboring rows. When a memory array is formed using the non-volatile DRAM cell 100, each memory row can be programmed or erased independently without affecting the data stored in the cells in the other rows of the array.

When compared with prior art schemes, in which a program and erase operation affects data stored in all the cells in the array, the array of the present embodiment has fewer erase and program cycles for most applications which involve writing data only to a portion of the memory array. After erase, the non-volatile DRAM cell 100 has a threshold of less than 1.0v. After program, the cell has a threshold voltage between 2.0 to 2.5. Therefore a delineation voltage of 1.5v can be used to distinguish the program and erase state of the floating gate 230. When the control gate 240 of the non-volatile DRAM cell 100 is coupled to the delineation voltage (1.5v), if the floating gate 230 is in the erase state, the pass-gate transistor 105 is turned on. If the floating gate 230 is in the program state, the pass-gate transistor 105 remains off. A sensing scheme can be devised to detect whether the pass-gate transistor 100 is on or off to determine the data state stored in the floating gate 230.

To access data stored in the cell capacitor 110, the pass-gate transistor 105 needs to be turned on. The control gate 249 in turn needs to be driven to a voltage higher than the threshold voltage of the pass-gate transistor 105 in the erase state. An over-drive voltage of about 2.5v when applied to the control gate 249 is sufficient to ensure that the pass-gate transistor 105 is turned on irrespective of the state in the floating gate 230.

Figure 3:
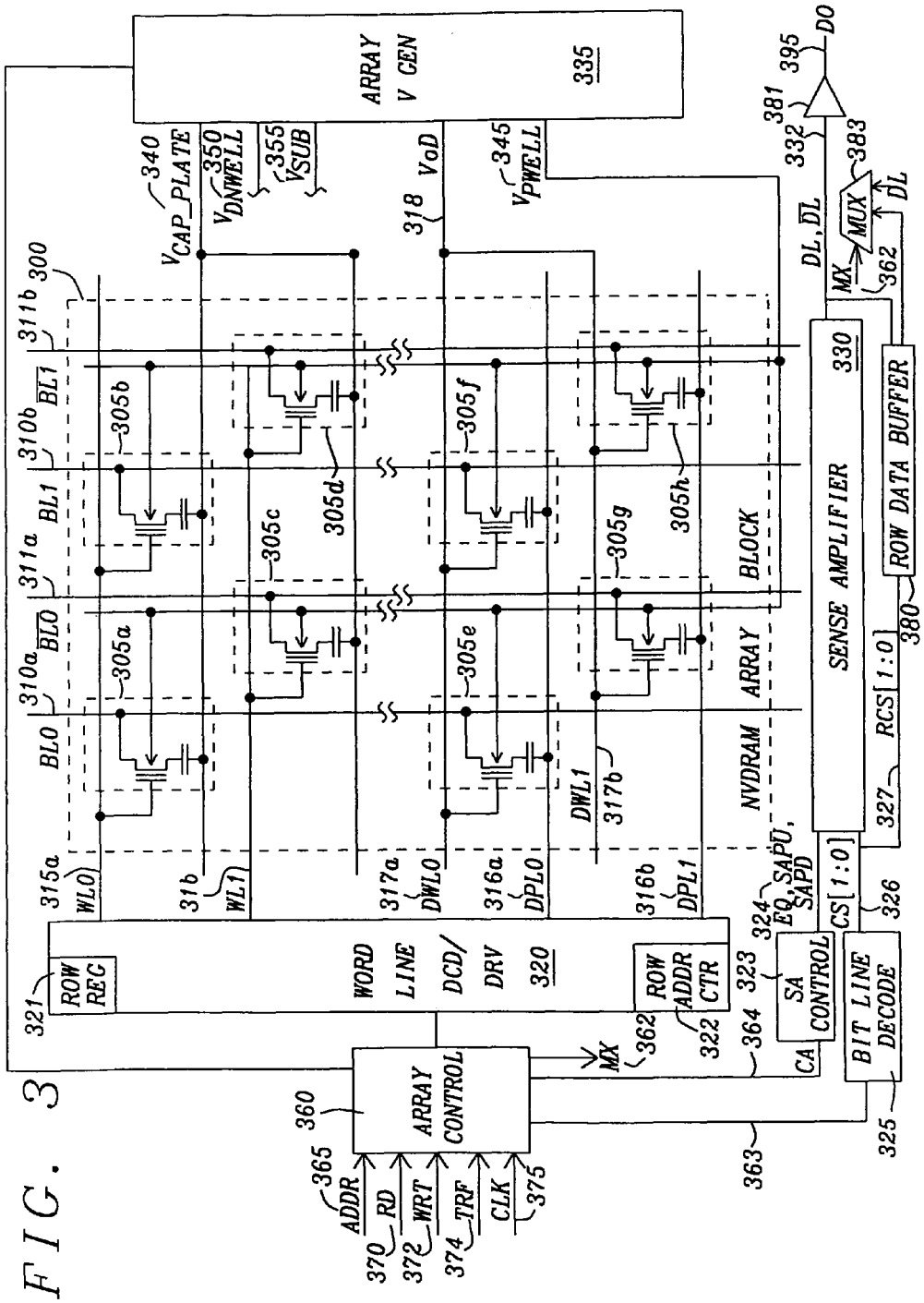
FIG. 3 is a schematic diagram of memory device of this invention having an array of non-volatile DRAM cells of this invention.
Figure 4:
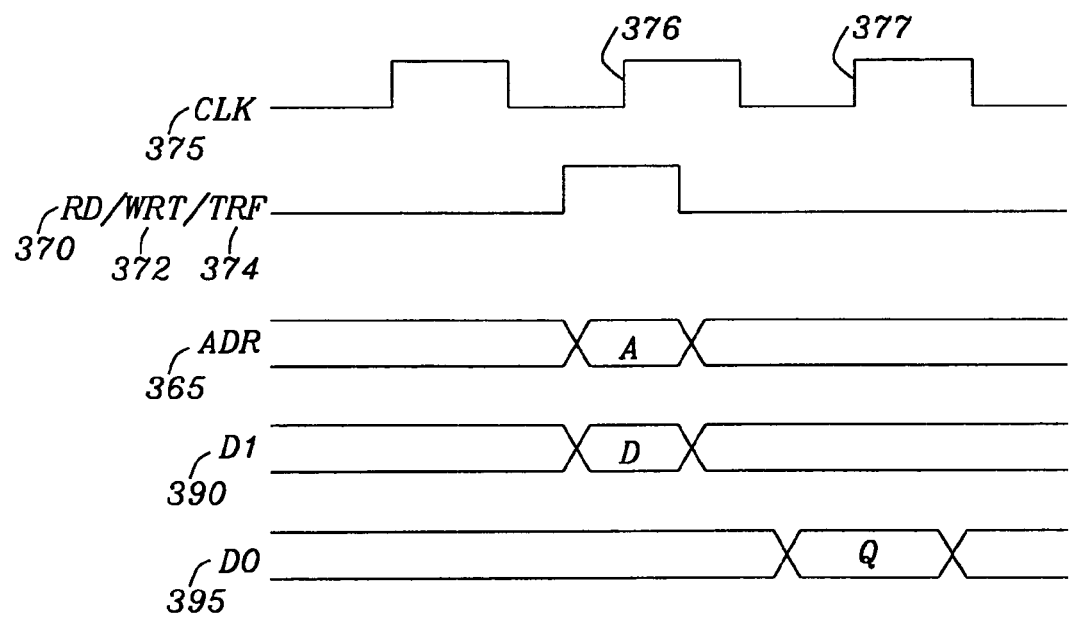
FIG. 4 is a diagram showing the timing waveforms of the interface signals for the read, write, and store operation of the non-volatile DRAM device.

FIG. 3 illustrates a schematic of a memory device including an array 300 formed using the non-volatile DRAM cells 305a, 305b, . . . , 305h of this invention as described in FIGS. 1 and 2. The memory device interfaces to memory accessing devices, such as a memory controller (not shown) that provides input and output signals: address ADR 365, read access RD 370, write access WR 372, transfer or store access TRF 374, clock CLK 375, data input DI 390, and data Output DO 395. FIG. 4 shows a timing waveform of the interface signals for a read, write, and store access. A memory access starts with the activation of the corresponding control signal (read access RD 370, write access WR 372, program PR, erase ER). For a read and write access 370 and 372, the accessing address is provided in the address bus 365. For a write access, write data is also provided in the data input bus 390. Upon receipt of the control signals (read access RD 370, write access WR 372, program PR, erase ER), accessing address signals 365, and the data input signal 390 (for a write), the following rise clock edge 376 in clock CLK 375 latches the control, address and data for the memory operation. For a read operation, read data is driven to the data out bus 390 before the end 377 of the clock cycle. For a store access, content in the address bus 365 and data bus 390 is ignored.

The non-volatile DRAM device further includes a word line decoder and driver 360, a bit line decoder 325, a sense amplifier control 323, an array control 360, an array voltage generator 335, a sense amplifier block 330, a row data buffer 380, an output data buffer 381, and an input data multiplexer 383.

The non-volatile DRAM cells 305a, 305b, . . . , 305d of the memory array 300 are arranged in rows and columns in a folded-bit-line structure similar to the one commonly used in DRAM array. In the folded bit line arrangement the bit lines BL0 310a and $\overline{BL0}$ 311a and BL1 310b and $\overline{BL1}$ 311b respectively form a complementary pairs of bit lines BL0 310a and $\overline{BL0}$ 311a and BL1 310b and $\overline{BL1}$ 311b that connect to the sense amplifier block 330. The complementary bit line pairs BL0 310a and $\overline{BL0}$ 311a and BL1 310b and $\overline{BL1}$ 311b conveniently allows differential sensing to be used for data read operations in both the DRAM and NVM mode. Array 300 also includes two rows of dummy cells 305e, 305f, . . . , 305h. The P-wells of the non-volatile DRAM cells 305a, 305b, . . . , 305h are merged together and coupled to the P-well voltage source 345 provided by the array voltage generator 335. The P-well voltage source 345 is connected to ground or 0v in the present embodiment. The common capacitor plate of each of the non-volatile DRAM cells 305a, 305b, . . . , 305d is coupled to the common plate bias 340 provided by the array voltage generator 335 and has a voltage equal to one half of the positive power supply voltage HVCC.

For illustration purpose, only 4 memory cells 305a, 305b, . . . , 305d and 4 dummy cells 305e, 305f, . . . , 305h is included in array 300. In practice, array 300 may include many rows and columns of the non-volatile DRAM cells. However, irrespective of the number of rows of non-volatile DRAM cells 305a, 305b, . . . , 305d in the array, only two rows of dummy cells 305e, 305f, . . . , 305h is required. For example array 300 may contains 1024 rows by 1024 columns of normal memory cells and 2 rows by 1024 columns of dummy cells.

The bit line decoder/driver 325 decodes the address transmitted 363 from the array control circuit 360 to select the column or columns to be accessed. The output of the bit line decoder/driver 325 couples to the column switches in the sense amplifier circuit 330 to select one of the sense amplifiers for coupling to the data line (DL) 332. Sense amplifier control circuit 323 controls the activation of the sense amplifiers 330 and the necessary pre-charging and equalization of the complementary bit line pairs BL0 310a and $\overline{BL0}$ 311a and BL1 310b and $\overline{BL1}$ 311b.

The word line decoder/driver 320 receives the row address and control signals from the array control circuit 360 and provides the different voltage levels to the word lines 315a, . . . , 315b for the different operations of non-volatile DRAM cells. The word line decoder/driver 320 incorporates a row tag register 321. Each bit in the row tag register 321 is associated with one row of non-volatile DRAM cells 305a, 305b, . . . , 305d. When the bit is set, it indicates the associated row of non-volatile DRAM cells 305a, 305b, . . . , 305d has been written to or modified. The tag bits are reset at power on.

The non-volatile memory device can support a more powerful memory transaction referred to as a store transaction. In the store transaction, the data stored in all the modified rows in the non-volatile DRAM device is transferred from the cell transistor to the floating gate of the pass-gate transistor with only one external command instead of using multiple transfer transaction commands to transfer modified row data one row at a time. The store or transfer access signal TRF 374 is set to indicate a store transaction command to transfer the current data present on the cell capacitor of each of the non-volatile DRAM cells 305*a*, 305*b*, . . . , 305*d* to the floating gate of the each of the non-volatile DRAM cells 305*a*, 305*b*, . . . , 305*d* for those rows of the non-volatile DRAM cells 305*a*, 305*b*, . . . , 305*d* where the row tag bit in the row tag register 321 is set to a logical "1". The store operation is facilitated with a row address counter 322. In the non-volatile DRAM device, the store data transfer is carried out one row at a time. When the store or transfer access signal TRF 374 is set to indicate a store transaction command, the row address counter 322 is reset so that its output bits are all reset to '0'. The row of the array of non-volatile DRAM cells 305*a*, 305*b*, . . . , 305*d* indicated by the reset row address counter has a transfer transaction performed. If the tag bit of the row tag register 321 associated with the first selected row pointed to by the row address counter has a value '1' indicating that the current data is present on the cell capacitors of the selected row of non-volatile DRAM cells 305*a*, 305*b*, . . . , 305*d*, the data is transferred from the cell capacitor to the floating gate of the pass gate transistor. If the tag bit associated with the selected row of non-volatile DRAM cells 305*a*, 305*b*, . . . , 305*d* is set to a value "0", the transfer operation is skipped. Next, the row address counter 322 is incremented to select the next row for the transfer operation. If the tag bit of the row tag register 321 for the newly selected row is set, the transfer operation carried out. If the tag bit is set to a value of "0", the transfer operation is skipped. The row address counter 322 is repetitively incremented until all row that have been modified and have their tag bits set to a value of "0" in the row tag register 321.

The array control circuit 360 receives the interface signals (read access RD 370, write access WR 372, store or transfer access TRF 374) and provides the address and timing control to the sense amplifier control circuit 323, the bit line decode circuit 325, the Word Line decoder/driver circuit 320, the Row Buffer 380 and the Data Input multiplexer 383.

The row data buffer 380 provides temporary storage for the data stored in the capacitors of the non-volatile DRAM cells 305*a*, 305*b*, . . . , 305*d* in the row selected for data transfer during a transfer operation.

The data multiplexer 383 selects the source of data to be written to the memory from input data bus DI 390, or the row data buffer 380.

The array voltage Generator 335 generates the different voltages (the common plate bias 340, the deep N-well biasing voltage 350, necessary for the operation of the memory array 300.

Figure 5:
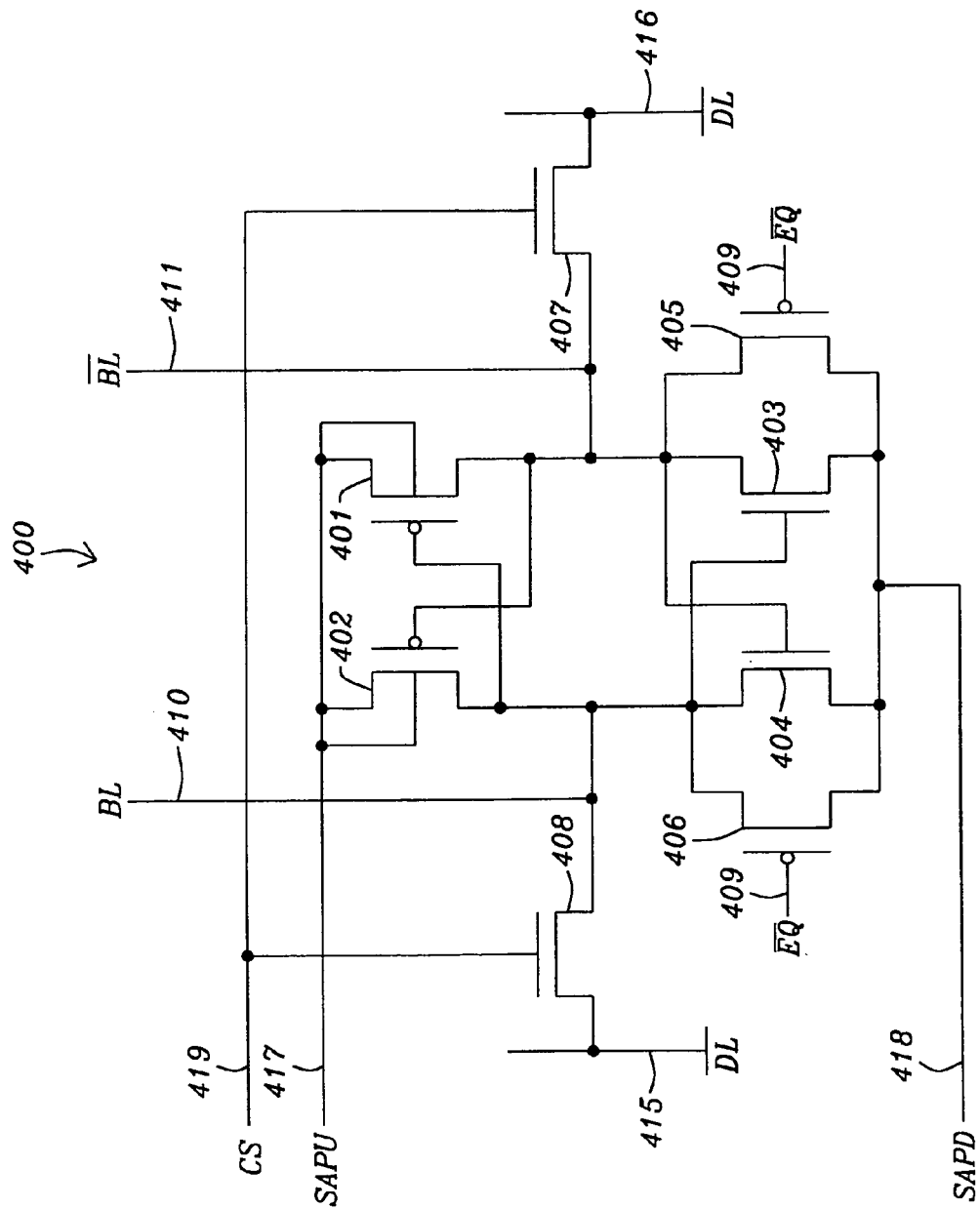
FIG. 5 is a schematic diagram of a sense amplifier of the non-volatile DRAM device of this invention.

The structure of a sense amplifier, used in the sense amplifier block 330, is shown in FIG. 5. Each complementary bit line pair BL0 310*a* and $\overline{BL0}$ 311*a* and BL1 310*b* and $\overline{BL1}$ 311*b* of the memory array 300 is coupled to a regenerative sense amplifier, for example BL0, $\overline{BL}$ 0 connects to one sense amplifier and BL1, $\overline{BL}$ 1 connects to a second sense amplifier. A sense amplifier 400 is a regenerative latched-type of sense amplifier that provides the bit-line sensing. The sense amplifier is similar to those commonly used in DRAM. In the present embodiment, sense amplifier 400 is used for the data sensing operation in both the DRAM mode and the NVM read mode. The P-channel transistors 401 and 402 and the N-channel transistors 403 and 404 form a regenerative latch that amplifies a difference in voltage between the bit line BL 410 and the complementary bit line $\overline{BL}$ 411 and latches this difference to determine a data state of the selected non-volatile DRAM cells. The gates of the P-channel transistor 401 and the N-channel transistor 403 are commonly connected to the drains of the P-channel transistor 402 and the N-channel transistor 404. The gates of the P-channel transistor 402 and the N-channel transistor 404 are connected to the commonly connected drains of the P-channel transistor 401 and the N-channel transistor 403. The bit line BL 410 is connected to the commonly connected drains of the P-channel transistor 402 and the N-channel transistor 404 and the complementary bit line BL 411 is connected to the commonly connected drains of the P-channel transistor 401 and the N-channel transistor 404. The sources of the P-channel transistors 401 and 402 are connected to a sense amplifier pull up signal 417 and the sources of the N-channel transistors 403 and 404 are connected to the sense amplifier pull down signal 418. The N-channel transistors 405 and 406 form an equalization and pre-charge circuit. The source of the N-channel transistor 405 is connected to BL and the source of the N-channel transistor 406 is connected to $\overline{BL}$. The drains of the N-channel transistors 405 and 406 are commonly connected to the sources of the N-channel transistors 403 and 404 and the sense amplifier pull down signal SAPD. The gates of the N-channel transistors 405 and 406 are commonly connected to the equalization signal EQ 409. The equalization signal EQ 409 activates and deactivates the N-channel transistors 405 and 406 to connect and disconnect the sense amplifier pull down signal 418 to the bit line BL 410 and the complementary bit line $\overline{BL}$ 411 to precharge and equalize the bit line BL 410 and the complementary bit line $\overline{BL}$ 411. The EQ signal 409, the SAPU signal 417 and the sense amplifier pull down signal 418 are generated by the sense amplifier control circuit 323. The N-channel transistors 407 and 408 form a column select circuit that selectively connects the bit line BL 410 and the complementary bit line $\overline{BL}$ 411 and the regenerative latch to the data line DL 415 and the complementary data line $\overline{DL}$ 416. The drain of the N-channel transistor 408 is connected to the data line DL 415 and the drain of the N-channel transistor 407 is connected to the complementary data line $\overline{DL}$ 416. The gates of the N-channel transistors 407 and 408 are commonly connected to the column select line 419. The column select line 419 is one of the connections that originate from the column decoder 325 of FIG. 3. The source of the N-channel transistor 408 is connected to the bit line BL 410 and drains of the P-channel transistor 402 and the N-channel transistor 404. The source of the N-channel transistor 407 is connected to the complementary bit line $\overline{BL}$ 411 and drains of the P-channel transistor 401 and the N-channel transistor 403.

The non-volatile DRAM device in the present embodiment supports three memory transactions: read, write, and transfer. The read transaction can access data stored in either the capacitors or the floating gates of the cells. To facilitate read access to the data stored in the floating gate, at power on, the capacitors of all the memory cells including the dummy cells is negatively charged with its lower-plate coupled to the ground or 0v. This is accomplished by coupling all the word lines to 2.5v and all the complementary bit line pairs to ground or 0v. Then the normal word lines are deactivated to 0v, turning the pass-gate transistor of the cells off and decoupling the capacitors from the bit lines. The dummy word lines stay at 2.5v. Subsequently, the complementary bit line pair BL 410 $\overline{BL}$ 411 is driven to the voltage equal to one half of the positive power supply voltage HVCC. It is advantageous to pre-condition the bottom plate of the cell capacitors to 0v because, with the p-well biased at this voltage, it is the natural state of the to capacitor of the non-volatile DRAM cell. Due to the leakage on the source-to-p-well junction of the pass-gate transistor, if the non-volatile DRAM cell is not refreshed for a long period of time, the voltage at the bottom plate of the capacitor drifts to a value close to 0v. Therefore, even though the cells are not refreshed after the pre-conditioning, the bottom-plate voltage of the cells stays close to 0v. The purpose of pre-conditioning of the capacitor voltage at power on will become apparent when the read operation is described below.

Figure 7:
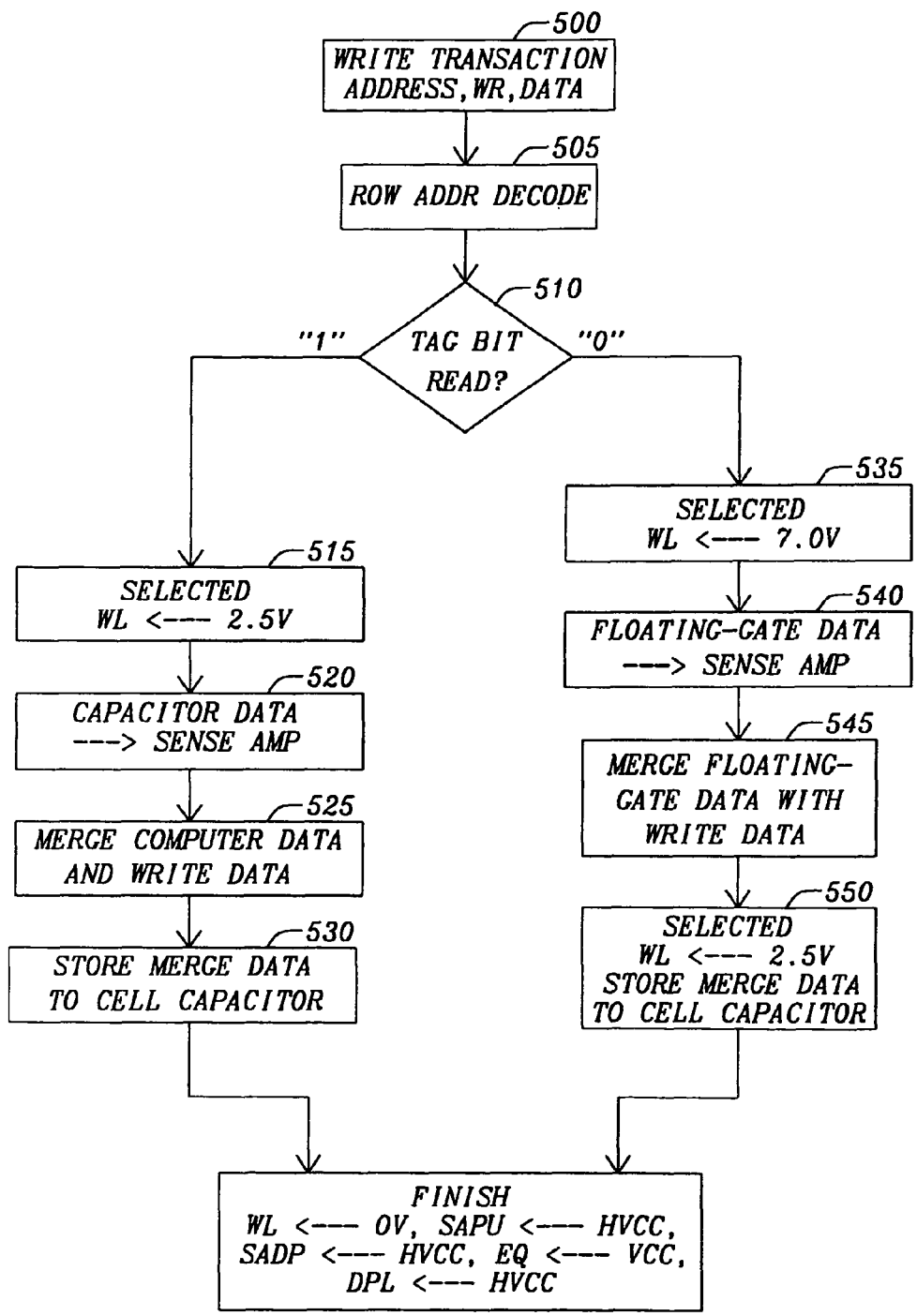
FIG. 7 is a flowchart for a process for writing data to a non-volatile DRAM device of this invention.

Referring to FIG. 4 for the interface timing, FIG. 3 for the internal operation of the memory device, and FIG. 7 for the flowchart of the write operation sequence. A write memory access starts (Box 500) with the accessing device supplying the memory address 365 and driving the write control signal WR 372 high. At the subsequent rising edge of the clock the memory address 365 and the write control signal WR 372 command state is latched in array control circuit 360. The row address is input to word line decoder/driver 320 where row address decoding (Box 505) is carried out. The row tag register 321 is read (Box 510) to determine the state of the tag bit associated with the selected row. If the tag bit is set, indicating the row was previously written and the capacitors of the cells in the row has the most updated data, the selected word line 315a, . . . , 315b is driven (Box 515) to the over-drive voltage (~2.5v). The capacitors are thus coupled to their corresponding complementary bit lines BL0 310a and $\overline{BL0}$ 311a and BL1 310b and $\overline{BL1}$ 311b to which the pass-gate connected. The data stored in the capacitors in the form of charge is sensed (Box 520) by the sense amplifiers 330. At the same time the write data at the data input DI 390 is coupled to the data output line DL 332 and then to the corresponding bit line BL0 310a and $\overline{BL0}$ 311a and BL1 310b and $\overline{BL1}$ 311b through multiplexer 383 and column switch transistors 407 and 408 (see FIG. 5). The single-ended data input signal 390 is converted into a differential signal through multiplexer 383 before driven into the differential data lines 332. The write data is thus merged (Box 525) with the existing data in the sense amplifiers 330 and then stored (Box 530) in the cell capacitors in the selected row of non-volatile DRAM cells 305a, 305b, . . . , 305d. The operation in which data stored in a row of non-volatile DRAM cells 305a, 305b, . . . , 305d is read, merged with the write data, and then restored back to the capacitor is similar to a common DRAM write operation. It is well understood by those skilled in the art of DRAM memory design. Therefore the DRAM write operation is not further elaborated.

If the tag bit associated with the select row of non-volatile DRAM cells 305a, 305b, . . . , 305d within the row tag register 321 is reset or has a value of '0', indicating that the floating gates of the cells in the row contain the correct data, then the selected word line 315a, . . . , 315b is driven (Box 535) to the delineate voltage (~1.5v). A NVM sensing operation is performed (Box 540) resulting in data stored in the floating gates getting latched in the sense amplifiers 330. The NVM sensing operation will be elaborated below when the NVM read operation is described. The latched data is merged (Box 545) with the write data which is coupled to the selected sense amplifier 330 through multiplexer 383 and the column switch transistors 407 and 408 (FIG. 5) of the selected sense amplifier 330. The activation of the column switches associated with the selected column is controlled by the bit line decoder 325 which receives the column address 363 from array control circuit 360. The activation of the sense amplifiers 330 is controlled by sense amplifier control circuit 323 which receives a column access signal CA 364 from the array control circuit 360. Subsequently, the selected word line 315a, . . . , 315b is driven to the over-drive voltage (~2.5v) and the merged data latched in the sense amplifiers 330 is stored (Box 550) in the cell capacitors of the selected row of non-volatile DRAM cells 305a, 305b, . . . , 305d. At the end of the write operation, the selected word line 315a, . . . , 315b is driven back to 0v thereby isolating the capacitors from the bit lines BL 410 and $\overline{BL}$ 411. The sense amplifiers 330 are deactivated with both sense amplifier pull down signal 418, and sense amplifier pull up signal 417 driven to the voltage equal to one half of the positive power supply voltage HVCC. The equalization signal 409 is driven high, coupling the bit lines BL0 310a and $\overline{BL0}$ 311a and BL1 310b and $\overline{BL1}$ 311b to the voltage equal to one half of the positive power supply voltage HVCC. The write operation is finished (Box 555) with the tag bit within the row tag register 321 for the selected row of non-volatile DRAM cells 305a, 305b, . . . , 305d set to '1'.

Figure 8:
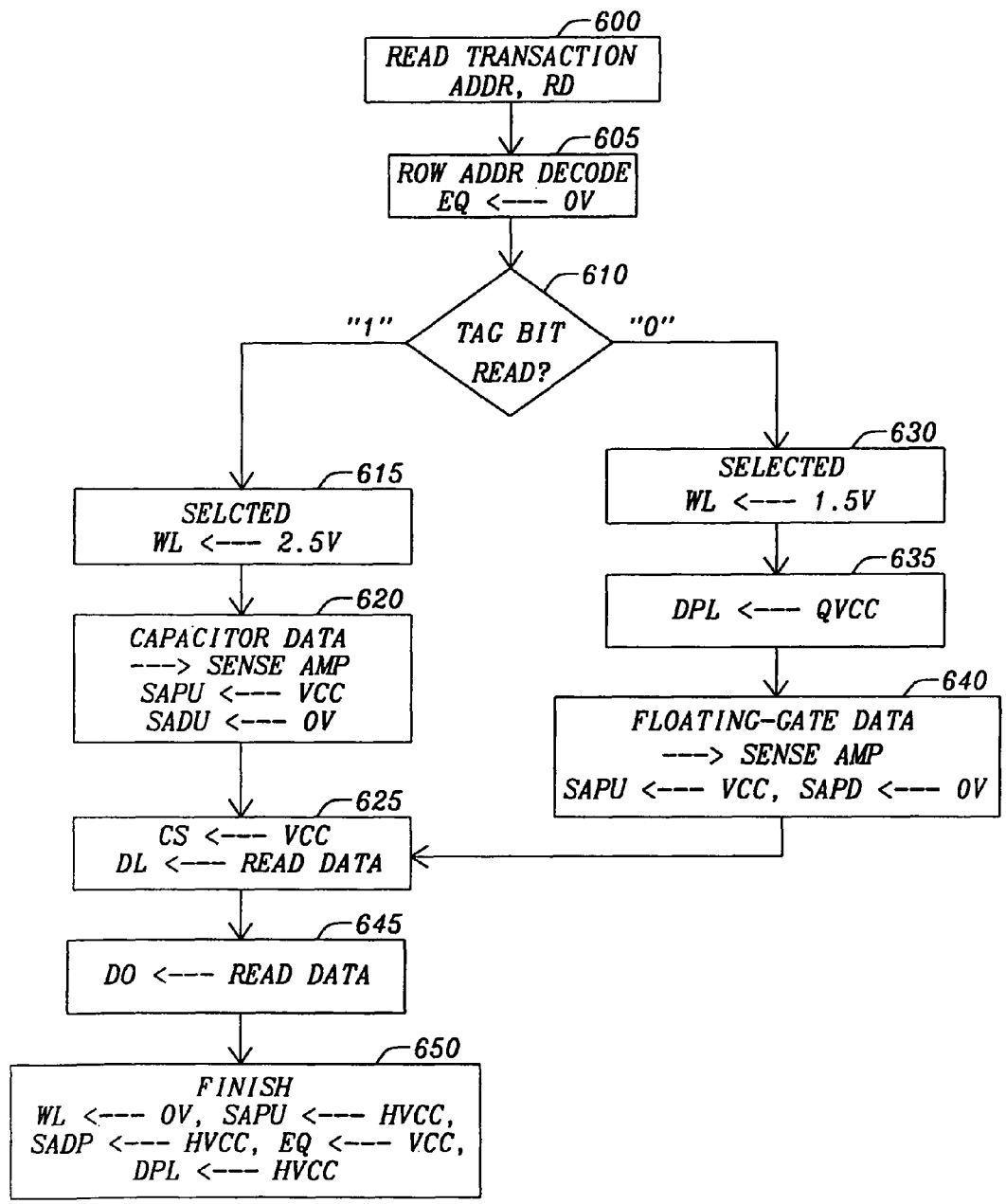
FIG. 8 is a flowchart for a process for reading data from a non-volatile DRAM device of this invention.

Refer now to FIG. 3, FIG. 5, and FIG. 8 for a description of the read operation sequence. A memory read access starts with the accessing device supplying (Box 600) the memory address 365 and driving the read control signal RD 370 high. At the following rising edge of the clock 375, the address 365 and the read control signal RD 370 is latched in array control circuit 360. The row address is input to Word Line decoder/driver circuit 320 where row address decoding (Box 605) is carried out. At the same time, sense amplifier control circuit 323 drives the equalization signal 409 low, isolating the complementary bit lines BL0 310a and $\overline{BL0}$ 311a and the BL1 310b and $\overline{BL}$ 311b from the sense amplifier pull down signal 418 (FIG. 5). Then the row tag register 321 is read (Box 610) to determine the state of the tag bit associated with the selected row of the non-volatile DRAM cells 305a, 305b, . . . , 305d is read. If the tag bit is set, indicating the row of the non-volatile DRAM cells 305a, 305b, . . . , 305d was previously written and the capacitors of the non-volatile DRAM cells 305a, 305b, . . . , 305d in the selected row has the most updated data, the selected word line 315a, . . . , 315b is driven (Box 615) to the over-drive voltage (~2.5v). The subsequent operation described below is similar to a common DRAM read operation and it is well understood by those skilled in the art of DRAM memory design. Therefore it will only be briefly described. The high voltage in the word line 315a, . . . , 315b turns on the pass-gate transistors of the non-volatile DRAM cells 305a, 305b, . . . , 305d which couple the corresponding cell capacitors to the complementary bit lines BL0 310a and $\overline{BL0}$ 311a and the BL1 310b and $\overline{BL1}$ 311b and causing in charge sharing between the cell capacitors and their corresponding complementary bit lines BL0 310a and $\overline{BL0}$ 311a and the BL1 310b and $\overline{BL1}$ 311b to occur. As a result, a differential voltage is developed in each complementary bit line pairs BL0 310a and $\overline{BL0}$ 311a and the BL1 310b and $\overline{BL1}$ 311b with the polarity of the differential voltage depends on the state of the data. Next, sense amplifier pull down signal 418 in sense amplifier 330 is driven low and sense amplifier pull up signal 417 is driven (Box 620) high activating the regenerative sense amplifiers in sense amplifiers 330. The sense amplifiers 330 amplify the differential voltages between each bit line of the complementary bit line pair BL0 310a and $\overline{BL0}$ 311a and the BL1 310b and $\overline{BL1}$ 311b. The column switch transistors 407 and 408 (FIG. 5) in the selected sense amplifier 400 are turned on with the corresponding column select line 419 driven high by the bit line decoder 325, coupling (Box 625) the data in the selected sense amplifier 330 to the data line DL 332. The read data on the data line DL 332 is subsequently driven (Box 645) by data buffer 381 to the output data line DO 395. The operation following the activation of the selected word line 315a, ..., 315b is similar to a common DRAM read operation.

If the tag bit associated with the select row of non-volatile DRAM cells 305a, 305b, ..., 305d has a state of '0', indicating that the floating gates of the cells in the row of non-volatile DRAM cells 305a, 305b, ..., 305d contain the correct data, then the selected word line 315a, ..., 315b is driven (Box 630) to the delineate voltage (~1.5v) and a NVM sensing operation is performed (Box 640) resulting in data stored in the floating gates getting latched in the sense amplifiers 330. The NVM sensing is now described. Referring to FIG. 3, array 300 contains two rows of dummy non-volatile DRAM cells 305e, 305f, ..., 305h connected to dummy word lines 317a and 317b. The construction of a dummy cell 305e, 305f, ..., 305h is identically to that of a normal cell. The dummy cells 305e, 305f, ..., 305h are not used to store data. Rather, they are used to provide a reference voltage for sensing during an NVM read operation. Two rows of dummy cells 305e, 305f, ..., 305h are required to ensure that every bit line BL0 310a and $\overline{BL0}$ 311a and $\overline{BL1}$ 310b and BL1 311b has a dummy cell 305e, 305f, ..., 305h attached to it. Due to the folded bit-line arrangement, a row of memory cells 305a, 305b, ..., 305d is coupled to only one of the bit line, BL or $\overline{BL}$, of the complementary bit line pairs BL0 310a and $\overline{BL0}$ 311a and the BL1 310b and $\overline{BL1}$ 311b. For example, in FIG. 3, the row containing the cells 305a and 305b connect to BL0 and BL1 while the row containing the cells 305c and 305d connect to $\overline{BL0}$ and $\overline{BL1}$. The dummy word lines DWL0 317a and DWL1 317b are coupled to the overdrive voltage $V_{OD}$ 318 of about 2.5v, generated by voltage generators 335, so that the pass-gate transistors of the dummy cells 305e, 305f, ..., 305h is always turned on. The common plate of the cell capacitors of the dummy non-volatile memory cells 305e, 305f, ..., 305h are coupled to dummy plate signal DPL0 316a and DPL1 316b respectively. During sensing operation, a normal non-volatile memory cells 305a, 305b, ..., 305d and a dummy non-volatile memory cells 305e, 305f, ..., 305h are activated simultaneously so that in each complementary bit line pair BL0 310a and $\overline{BL0}$ 311a or BL1 310b and $\overline{BL1}$ 311b, one bit line $\overline{BL0}$ 310a or BL0 311a or BL1 310b or $\overline{BL1}$ 311b couples to a normal cell 305a, 305b, ..., 305d and the other bit line of the pair BL0 310a or $\overline{BL0}$ 311a or $\overline{BL1}$ 310b or BL1 311b couples to an activated dummy cell 305e, 305f, ..., 305h. The dummy non-volatile memory cells 305e, 305f, ..., 305h are activated by setting (Box 635) one of the dummy plate signals DPL0 316a and DPL0 316b to the a voltage level that is one-quarter of the power supply voltage source QVCC.

Figure 6:
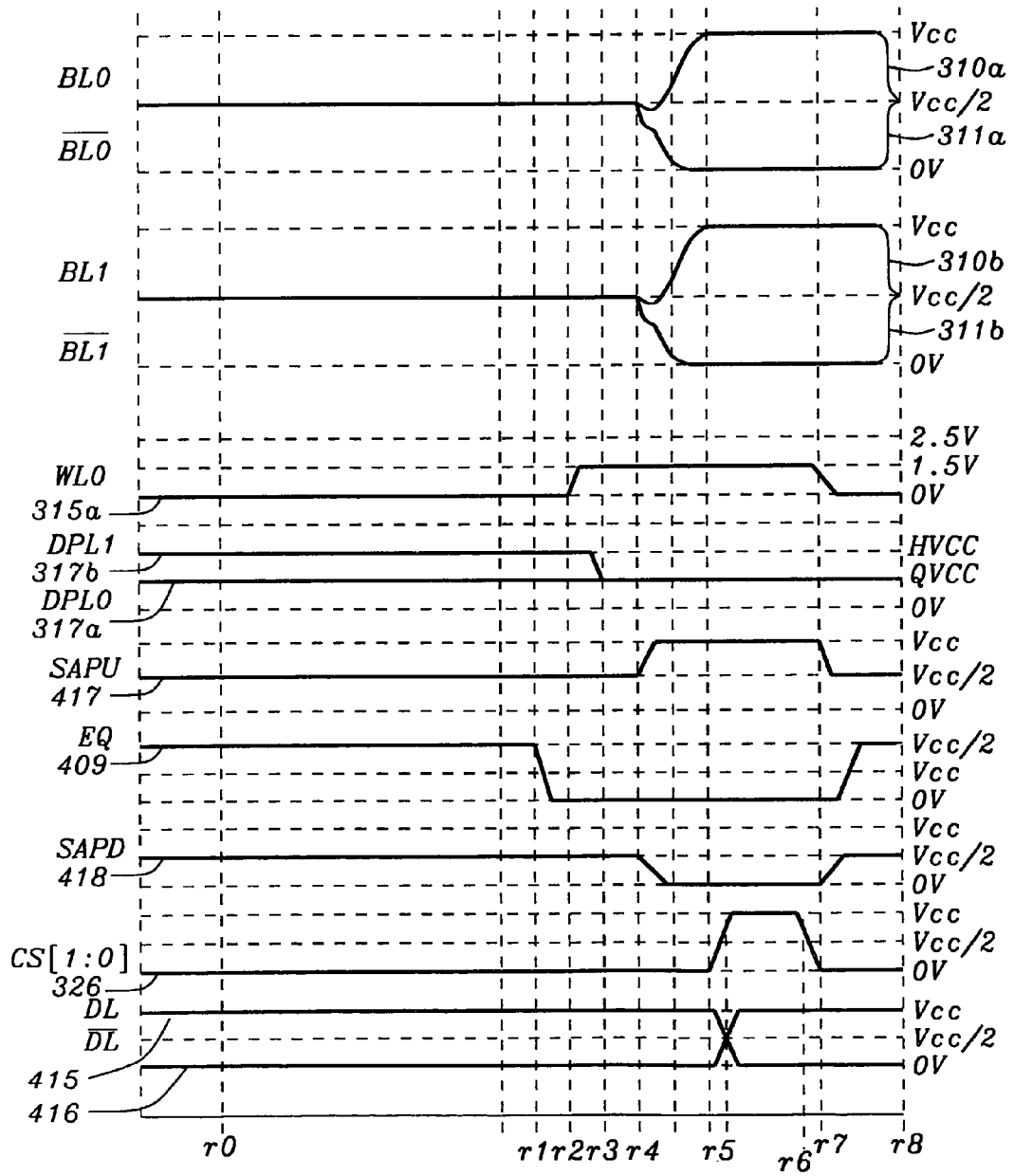
FIG. 6 is a timing diagram for reading a data state stored on the floating gate pass transistor of the non-volatile DRAM cell of this invention.

FIG. 6 shows the timing of the NVM read operation. At the time $\tau_0$, sense amplifier pull up signal 417 and sense amplifier pull down signal 418 are driven by the array control circuit 380 to voltage equal to one half of the positive power supply voltage HVCC or Vcc/2. With the equalization signal 409 in the activated high state, the equalization transistors 405 and 406 are turned on, coupling bit lines BL0 310a and $\overline{BL0}$ 311a and BL1 310b and $\overline{BL1}$ 311b to voltage equal to one half of the positive power supply voltage or $V_{CC}/2$. At the time $\tau_1$, the equalization signal 409 is driven low thus turning the equalization transistors 405 and 406 off and isolating the bit lines BL0 310a and $\overline{BL0}$ 311a and BL1 310b and $\overline{BL1}$ 311b. At the time $\tau_2$, the selected word line word line 315a, is driven by the word line decoder/driver 320 to the delineate voltage of approximately 1.5V. Note that the bottom plate of the cell capacitors in an unmodified row is pre-charged to 0v at power up. Assuming that floating gate of the non-volatile memory cells 305a and 305b are in an erased and programmed state respectively. Then the pass-gate transistor of the non-volatile memory cell 305a is turned on coupling the cell capacitor to bit line 310a, causing charge sharing between the cell capacitor and the bit line capacitor to occur and results in a bit line voltage of Delta ($V_A$) below the voltage level equal to one half of the positive power supply voltage HVCC. Where the voltage level $V_A$ is determined by the equation:

$$V_A = HVCC\ [Cc/(Cc+Cbl)]$$

Where:
$V_A$ is the voltage differential (Delta) caused by charge sharing,
Cbl is the bit line capacitance, and
Cc is the capacitance of the cell capacitor of the selected non-volatile DRAM cells 305a, 305b, ..., 305d.

The pass-gate transistor of the non-volatile memory cell 305b remains off and bit line 310b remains at the voltage level equal to one half of the positive power supply voltage HVCC. At time $\tau_3$, the common plate signal DPL1 of dummy row 382 is driven from voltage equal to one half of the positive power supply voltage HVCC to a voltage level that is equal to one-quarter the voltagae of the power supply voltage source QVCC. With the pass-gate transistor of dummy cells 305g and 305h turned on, bit lines $\overline{BL0}$ and $\overline{BL1}$ are coupled to a voltage equal to $V_A/2$ or HVCC [Cc/2(Cc+Cbl)]. The voltage difference between the bit lines BL0 310a and $\overline{BL0}$ 311a is equal to the voltage level $-V_A/2$ but the voltage difference between bit lines BL1 310b and $\overline{BL1}$ 311b is equal to the voltage level $V_A/2$.

At time $\tau_4$, sense amplifier pull down signal 418 is driven to 0v and sense amplifier pull up signal 417 is driven to voltage level of the power supply voltage source Vcc turning on the regenerative latch formed by transistors 401, ..., 405 to amplify the signals in the bit lines BL0 310a and $\overline{BL0}$ 311a and BL1 310b and $\overline{BL1}$ 311b to ground Vcc, Vcc and ground respectively. Thereby a data state of '0' for the erased state and '1' for the programmed state. Note that if word line WL1 315b is accessed instead, the data value for the erased state and programmed state is '1' and '0', respectively, which is the inverse of those from the word WL0 315a. This is because cells coupled to the word line WL0 315a are connected to the bit lines BL0 310a and BL1 310b but cells coupled to word line WL1 315b are connected to the compliment of the bit lines $\overline{BL0}$ 311a and $\overline{BL1}$ 311b. A data inversion is performed in the output buffer 381 for accesses to odd word lines.

At the time $T_5$, one of the column switch enable signals CS[1:0] 326, for example CS[0], is driven high turning on column-switch transistors 407 and 408 in selected sense amplifier, and coupling the bit lines BL0 311a and $\overline{BL0}$ 311a to the data lines DL 415 and $\overline{DL}$ 415. A read data of '0' is thus driven to data line DL 415 and subsequently driven by output data buffer 381 to output data bus DO 395 of FIG. 3. At the time $\tau_6$, the column switch signal CS0 326 is driven to 0v, deactivating the column-switch transistors 407 and 408 of FIG. 5 and isolating the selected sense amplifier from data lines DL 415 and DL 415.

At the time $\tau_7$, the word line WL0 315a is driven to 0v turning pass-gate transistors of non-volatile memory cells 305a and 305b off, and dummy plate signal DPL1 316a is driven to the voltage equal to one half of the positive power supply voltage HVCC. At the time $\tau_8$, the sense amplifier control signals SAPD 418 and SAPU 417 are driven to the voltage equal to one half of the positive power supply voltage HVCC while equalization signal 409 is activated high, turning equalization transistors 405 and 406 on, coupling the bit lines BL0 310a and $\overline{BL0}$ 311a and BL1 310b and $\overline{BL1}$ 311b to the voltage equal to one half of the positive power supply voltage HVCC and completing the NVM read operation. The bottom plate of the cell capacitors does not require re-charge to 0v as the regenerative sense amplifier automatically charges the cell capacitor to 0v for the erased non-volatile DRAM cells during the sensing process. For the programmed cell, the capacitor voltage is irrelevant because the pass-gate transistor of the non-volatile DRAM cell is not turned on during the sensing process.

Figure 9:
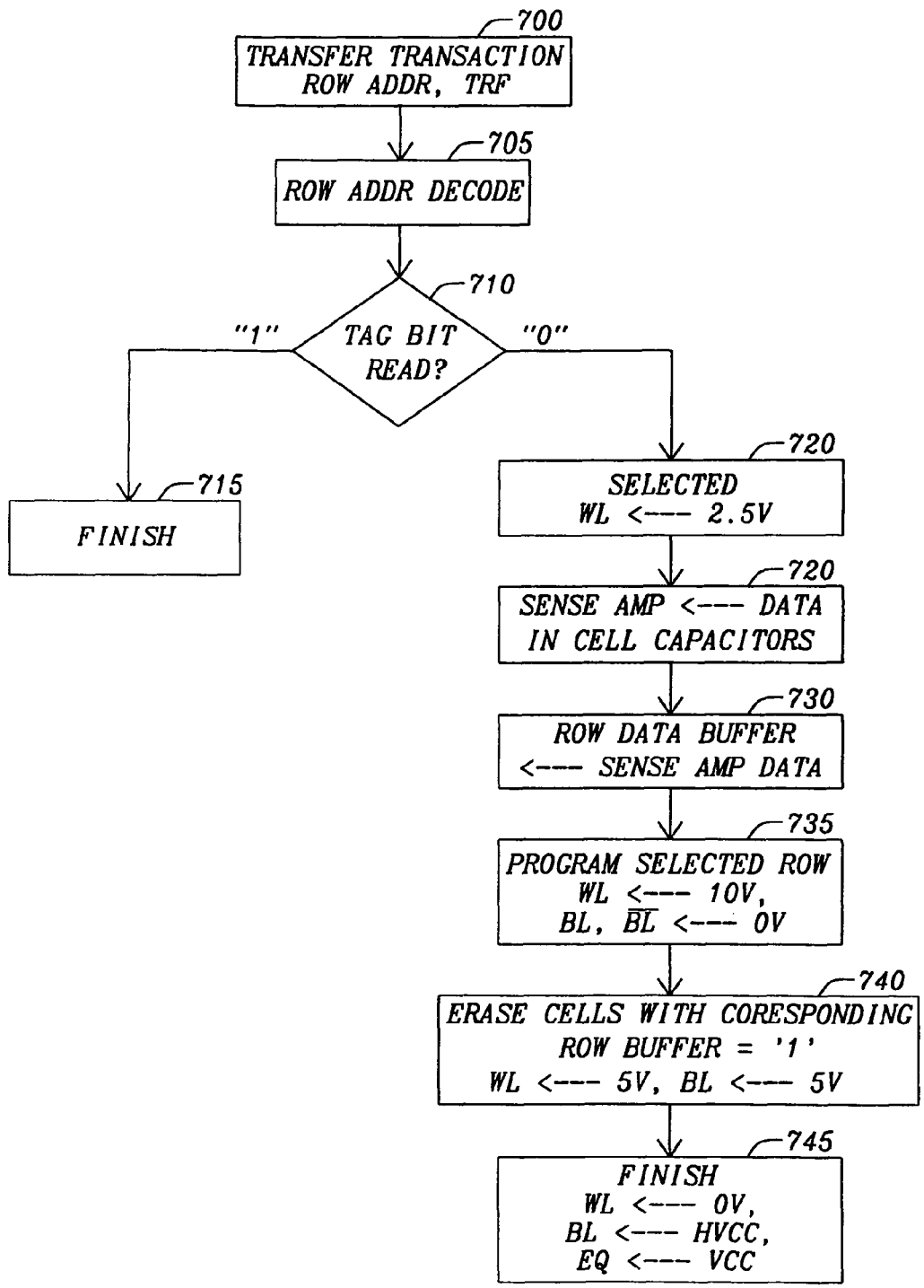
FIG. 9 is a flowchart for a process for a transfer operation for a non-volatile DRAM device of this invention.

A transfer transaction transfers data stored in the capacitors of a row of non-volatile DRAM cells to the floating gates of the corresponding non-volatile DRAM cells. Refer now to FIG. 3, FIG. 5 and FIG. 9 for a discussion of the transfer transaction. FIG. 9 is a flowchart that shows the transfer transaction operation sequence of the non-volatile DRAM device. A transfer transaction starts with the accessing device placing (Box 700) the address of the row in which data transfer to take place on the address bus 365 and activating the read control signal RD 370 to a logical high level. At the following rising edge of the clock 375, the row address and the TRF command state 374 is latched in array control circuit 360.

Assume that the memory row of non-volatile DRAM cells 305c and 305d associated with word line WL1 315b is selected for the transfer operation, the row address latched in Array Control circuit 360 is decoded (Box 705) in Word Line decoder/driver 320. The row tag register 321 is read (Box 710) to determine the state of the tag bit associated with the selected row. If the tag bit of the selected row of non-volatile DRAM cells 305c and 305d has a state of '0', indicating that the most updated data is stored in the floating gates of the non-volatile DRAM cells 305c and 305d, then the transfer operation is terminated (Box 715). No further operation is necessary, as the most updated data is already in the floating-gate of the non-volatile DRAM cells 305c and 305d in the selected row.

If the tag bit has a state of '1', indicating that the most updated data is stored in the cell capacitors of the selected row of non-volatile DRAM cells 305c and 305d, then Word Line decoder/driver 320 drives (Box 720) the word line WL1 315b to the over-drive voltage of 2.5v. Data stored in the capacitor of non-volatile DRAM cells 305c and 305d is coupled to bit lines BL0 and BL1. The sense amplifiers 330 are then activated by sense amplifier control circuit 323 with equalization signal 409 deactivated low followed by sense amplifier pull up signal 417 and sense amplifier pull down signal 418 driven to Vcc and 0v respectively. As a result, data stored in the capacitors of non-volatile DRAM cells 305c and 305d is latched (Box 725) in the sense amplifiers 330. Subsequently, the bit line decoder 325 activates one at a time the column switches enable signals CS[1:0] 326 and the corresponding row buffer column select signals RCS[1:0] 327 to transfer (Box 730) the data from the sense amplifiers 330 to the Row Data Buffer 380 through data line DL 332. Next, a program operation is performed (Box 735) to on all the non-volatile DRAM cells 305c and 305d in the selected row. Since both non-volatile DRAM cells 305c and 305d are connected to the complement bit lines $\overline{BL0}$ 311a and BL1 311b, data read out from the non-volatile DRAM cells 305c and 305d is inherently inverted, that is, erased state in the floating gate represents data '1' and programmed state represents data '0'.

After the program operation, an erase operation is performed (Box 740) on the non-volatile DRAM cells 305c and 305d with the corresponding row buffer data bits equal to '1'. The transfer operation is completed (Box 745) with the word line WL1 315b returned to a 0v level, the complementary bit line pairs BL0 310a and $\overline{BL0}$ 311a and BL1 310b and $\overline{BL1}$ 311b returned to the voltage equal to one half of the positive power supply voltage HVCC, and the equalization signal 409 is set to the voltage level of the power supply voltage source VCC.

Figure 10:
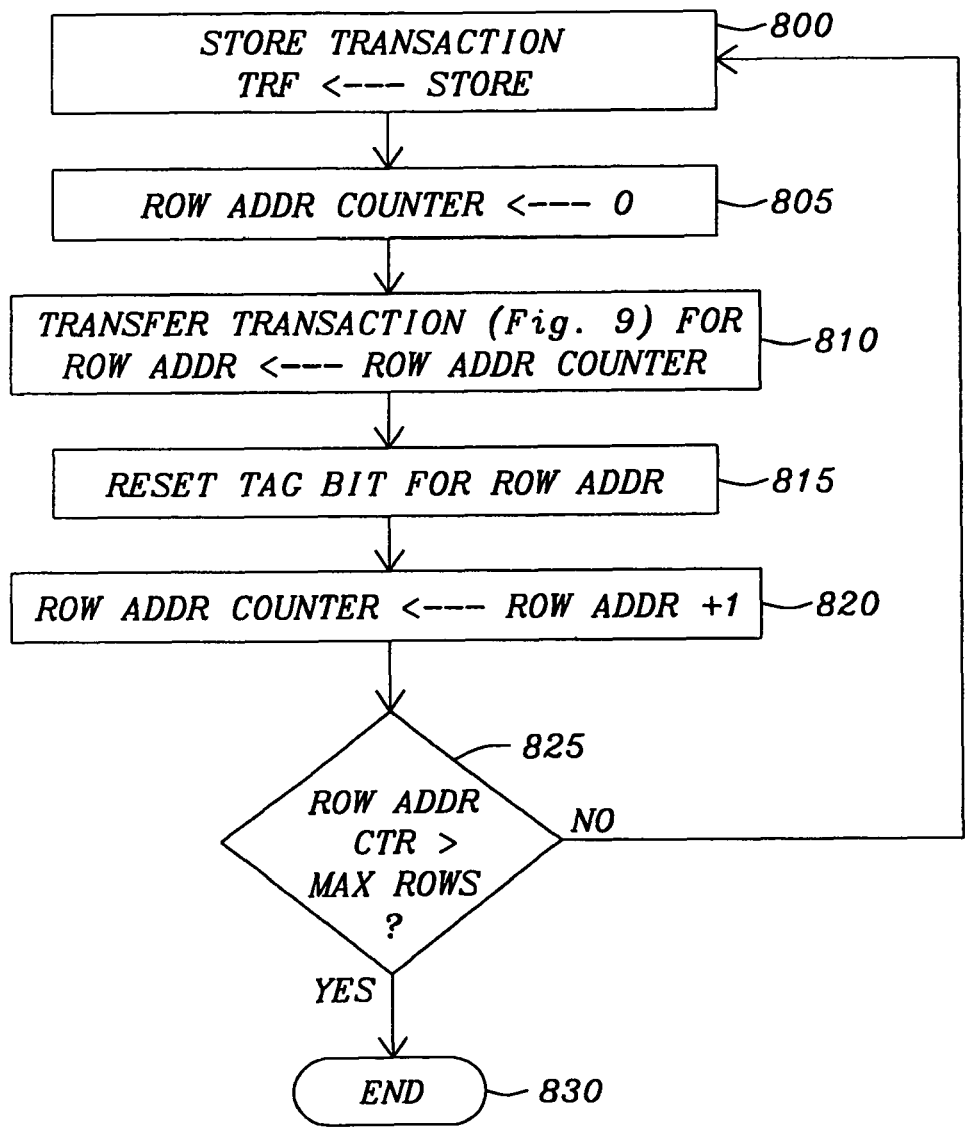
FIG. 10 is a flowchart for a process for a store operation for a non-volatile DRAM device of this invention.

As described above, the non-volatile memory device can support a more powerful memory transaction referred to as a store transaction. Refer now to FIG. 3, FIG. 5 and FIG. 10 for a discussion of the store transaction. FIG. 10 is a flowchart that shows the store transaction operation sequence of the non-volatile DRAM device. A store transaction starts with the accessing device setting (Box 800) the TRF command state 374 to indicate the store transaction. At the following rising edge of the clock 375, the TRF command state 374 is latched in array control circuit 360. In the store transaction, the data stored in all the modified rows in the non-volatile DRAM device is transferred from the cell capacitor to the floating gate of the pass-gate transistor with only one external command instead of using multiple transfer transaction commands to transfer modified row data one row at a time. The store operation is facilitated with the row address counter 322. In the non-volatile DRAM device, the write data transfer is carried out one row at a time. When the store or transfer access signal TRF 374 is set to indicate a store transaction command, the row address counter 322 is initialized (Box 805) so that its output bits are all reset to '0'.

The row of the array of non-volatile DRAM cells 305a, 305b, . . . , 305d indicated by the initialized row address counter 322 has a transfer transaction performed (Box 810). Performing the transfer function (Box 810) is as described in FIG. 9. If the tag bit of the row tag register 321 associated with the first selected row pointed to by the row address counter has a value '1' indicating that the current data is present on the cell capacitors of the selected row of non-volatile DRAM cells 305a, 305b, . . . , 305d, the data is transferred from the cell capacitor to the floating gate of the pass gate transistor. The tag bit is reset (Box 815) to the value "0" indicating that the current data is now residing in the floating gate of the pass gate transistor. If the tag bit associated with the selected row of non-volatile DRAM cells 305a, 305b, . . . , 305d is already set to a value "0", the transfer operation is skipped.

Next, the row address counter 322 is incremented (Box 820) to select the next row for the transfer operation. If the tag bit of the row tag register 321 for the newly selected row is set, the transfer operation (Box 810) is carried out. If the tag bit is set to a value of "0", the transfer operation (Box 810) is skipped. The row address counter is compared (Box 825) to a maximum row value, indicating the maximum number of rows in the array 300 of non-volatile DRAM cells 305a, 305b, . . . , 305d. The row address counter 322 is repetitively incremented until all rows that have been modified and have their tag bits set to a value of "0" in the row tag register 321. The row address counter then exceeds the maximum number of rows and the store transaction is completed (Box 830).

Referring now to FIG. 3, FIG. 5, and Table 1 (below), for the program and erase operation of the non-volatile floating gate of the pass-gate transistor of the non-volatile DRAM cell. Program operation is performed with all the non-volatile DRAM cells 305a, 305b, . . . , 305d in a selected row programmed simultaneously. Assuming for example that the non-volatile DRAM cells 305a and 305b associated with the WL0 315a is selected for the program operation. The operation is carried out with word line 315a being driven to a voltage level of approximately 10.0V while the deselected word line WL1 315b being held at 0v by the word line decoder/driver 320. The sense amplifier control 323 drives all the bit lines BL0 310a and $\overline{BL0}$ 311a and BL1 310b and $\overline{BL1}$ 311b to 0v by coupling the sense amplifier pull down signal 418 of the sense amplifier 330 to 0.0v and the equalization signal 409 to the voltage level of the power supply voltage source Vcc. A potential difference of approximately +10.0V is imposed between the drain and the control gate of the pass-gate transistor of all the non-volatile DRAM cells 305a and 305b of the selected row. As a result, electrons are injected from the drain to the channel region and then tunnel (Fowler-Nordheim tunneling) to the floating gate of the non-volatile DRAM cells 305a and 305b. The tunneled electrons are trapped in the floating gate of the selected non-volatile DRAM cells 305a and 305b thereby increase the threshold voltage of the pass-gate transistor of the non-volatile DRAM cells 305a and 305b of the selected row. For the cells 305c, 305d, . . . , 305h in the unselected rows, with both the control gate and the drain of their pass-gate transistors coupled to 0v, the electric field between their control gate and drain is zero and the charge in the floating gates of these cells is not affected. Since the pass-gate transistors in the unselected rows are not turned on, the charge stored in the capacitors are not affected.

An Erase operation can be carried out on only one cell or simultaneously on multiple cells of the same row. The erase operation is carried out by coupling the selected word line WL0 315a of one selected non-volatile DRAM cell 305a to approximately −5.0v and the bit line BL0 310a to which the non-volatile DRAM cell 305a connected to approximately 5.0v. With the bulk of the selected cell remaining at 0.0v, the drain-to-bulk junction of the pass-gate transistor is under large reverse bias causes band-to-band tunneling to occur. Consequently, holes tunnel from the drain to the channel area of the pass-gate transistor of the selected non-volatile DRAM cell 305a. Since a relatively large field between the control gate and the bulk is also created by the word line WL0 315a bias, holes tunneled to the channel region are accelerated and tunnel to the floating gate. Consequently, positive charge in the floating gate of the selected non-volatile DRAM cell 305a is increased thereby lowering the threshold voltage of the pass-gate transistor. The deselected word lines WL1 315b and bit lines $\overline{BL0}$ 311a and BL1 310b and $\overline{BL1}$ 311b stay at 0v. For a pass-gate transistor with gates connected to a deselected word line 315b, 316a, and 316b but its drain connected to a selected bit lines BL0 310a the drain-to-bulk junction has a potential of 5.0V but the control gate has a potential of 0V. The absence of the vertical field between the control gate and the channel is not sufficient to cause substantial Fowler-Nordheim tunneling to occur. For a pass-gate transistor connected to a deselected word line 315b, 316a, or 316b and the deselected bit line $\overline{BL0}$ 311a, BL1 310b or $\overline{BL0}$ 311b, no potential difference exists between the bulk, the control gate and the drain. Therefore, the charge in the floating gate of the pass-gate transistor is not affected. For a cell connected to a selected word line 315a and unselected bit lines $\overline{BL0}$ 311a, BL1 310b or $\overline{BL}$ 311b, no potential difference exists between the drain and bulk of the transistor of the cell. As a result, band-to-band tunneling does not take place and the charge in the pass-gate transistor is not affected. Therefore the program and erase disturbance to the unselected cells in the array is insignificant. Furthermore, the control gate voltage in the unselected word line is driven to 0V, therefore the pass-gate transistors in the unselected rows is not turned on and thus the charge in the capacitors in the cells of the unselected rows are not affected by the erase operation.

TABLE 1

| OPERATION | BL0 | BL0 | BL1 | BL1 | WL0 | WL1 |
|---|---|---|---|---|---|---|
| EEPROM | | | | | | |
| PROGRAM | 0.0 V | 0.0 V | 0.0 V | 0.0 V | 10.0 V | 0.0 V |
| ERASE | 0.0 V | 5.0 V | 0.0 V | 0.0 V | −5.0 V | 0.0 V |
| READ | FLOATING PRECHARGE TO HVCC | FLOATING PRECHARGE TO HVCC | FLOATING PRECHARGE TO HVCC | FLOATING PRECHARGE TO HVCC | 0.0 V | 1.5 V |
| DRAM | | | | | | |
| READ | FLOATING PRECHARGE TO HVCC | FLOATING PRECHARGE TO HVCC | FLOATING PRECHARGE TO HVCC | FLOATING PRECHARGE TO HVCC | 0.0 V | 2.5 V |
| WRITE | DATA | DATA | DATA | DATA | 0.0 V | 2.5 V |

While this invention has been particularly shown and described with reference to the preferred embodiments thereof, it will be understood by those skilled in the art that various changes in form and details may be made without departing from the spirit and scope of the invention.

The invention claimed is:

1. A non-volatile DRAM memory cell comprising:
   a capacitor comprising a bottom-plate and a top plate coupled to a common plate node for retaining a first bit of data; and
   an NMOS pass-gate transistor comprising a drain connected to a bit line a control gate connected to a word line, a source connected to the bottom plate, and a floating gate isolated from and beneath the control gate; and gate for retaining a second bit of data;
   wherein reading the second bit of data to the floating gate of the NMOS pass-gate transistor is accomplished by:
      precharging the bit line to a voltage equal to one half of the positive power supply voltage;
      setting the word line to a data delineation voltage level, and
      sensing a differential voltage between the bit line and a complementary bit line for determining a data state of the second bit of data.

2. The non-volatile DRAM cell of claim 1 wherein the second bit of data is programmed and erased by charges injected from the drain to the floating gate.

3. The non-volatile DRAM cell of claim 1 wherein the second bit of data is erased from the floating gate by gate-induced-drain-lowering assisted band-to-band tunneling and second bit of data programmed to the floating gate by Fowler Nordheim tunneling.

4. The non-volatile DRAM cell of claim 1 wherein the capacitor stores the first bit of data as updated data and the floating gate stores the second bit of data as data that has not been updated.

5. The non-volatile DRAM cell of claim 1 wherein programming the second bit of data to the floating gate of the NMOS pass-gate transistor is accomplished by:
setting the selected word line to a large positive programming voltage level,
setting a bit line to a ground reference voltage level,
setting the word line to a relatively large positive voltage level such that charges of a first type are injected from the bit line through the drain to a floating gate of the floating gate pass transistor.

6. The non-volatile DRAM cell of claim 1 wherein erasing the second bit of data to the floating gate of the NMOS pass-gate transistor is accomplished by:
setting the bit line to an intermediate positive erasing voltage level, and
setting the word line to an intermediate negative erasing voltage level such that charges of a second type are injected from the bit line through the drain from the floating gate of the floating gate pass transistor.

7. The non-volatile DRAM cell of claim 5 wherein the large positive programming voltage level is approximately 10.0v.

8. The non-volatile DRAM cell of claim 6 wherein the intermediate positive erasing voltage level is approximately 5.0v and the intermediate negative erasing voltage level is approximately −5.0v.

9. The non-volatile DRAM cell of claim 1 wherein the data delineation voltage level is approximately 1.5v.

10. The non-volatile DRAM cell of claim 1 wherein reading the first bit of data to the capacitor of the NMOS pass-gate transistor is accomplished by:
setting the word line to an over-drive voltage level to turn on the NMOS pass-gate transistor and transfer a charge representing the first bit of data from the capacitor, and
sensing a differential voltage between the bit line and a complementary bit line for determining a data state of the first bit of data.

11. The non-volatile DRAM cell of claim 10 wherein the over-drive voltage level is approximately 2.5v.

12. The non-volatile DRAM cell of claim 1 wherein writing the first bit of data to the capacitor of the NMOS pass-gate transistor is accomplished by:
setting the word line to an over-drive voltage level to turn on the NMOS pass-gate transistor,
setting the bit line and a complementary bit line to a voltage level and a complementary voltage level representing a new data to be written to the capacitor; and
charging the capacitor based on the voltage level representing the new data level.

13. The non-volatile DRAM cell of claim 12 wherein the over-drive voltage level is approximately 2.5v.

14. A method for operation of an array of non-volatile DRAM cells comprising the steps of:
providing a plurality of non-volatile DRAM cells arranged in rows and columns, each non-volatile DRAM cell comprising:
a capacitor comprising a bottom-plate and a top plate coupled to a common plate node for retaining a first bit of data, and
an NMOS pass-gate transistor comprising a drain connected to a bit line, a control gate connected to a word line, a source connected to the bottom plate, and a floating gate isolated from and beneath the control gate for retaining a second bit of data;
associating each row of the non-volatile DRAM cells with a tag designator indicating that the first bit of data and the second bit of data are identical or different;
initiating a store transaction for transferring the first data bit from the capacitor to the floating gate of the NMOS pass-gate transistors of the non-volatile DRAM cells of the rows of the non-volatile DRAM cells when the tag designator of a selected row indicates that the first bit of data and the second bit of data are different, wherein initiating the store transaction comprises the steps of:
a.) initializing a row count to a selected row;
b.) jumping to step f.), when the tag designator of a selected row indicates that the first bit of data and the second bit of data are not different;
c.) reading the first bit of data for each non-volatile DRAM cell of the selected row of the non-volatile DRAM cells to a data buffer associated with the column of each of the non-volatile DRAM cells,
d.) programming the floating gates of each of the non-volatile DRAM cells of the selected row of the non-volatile DRAM cells to a program state, and
e.) erasing the floating gates of each of the non-volatile DRAM cells of the selected row of the non-volatile DRAM cells that have the first data bit set to an erase state such that the second data bit is the erase state;
f.) incrementing the row count and performing steps b.) through e.) until all rows are completed.

15. The method for operation of claim 14 wherein reading the first bit of data to the capacitor of the NMOS pass-gate transistor comprises steps of:
setting the word line to an over-drive voltage level to turn on the NMOS pass-gate transistor and transfer a charge representing the first bit of data from the capacitor; and
sensing a differential voltage between the bit line and a complementary bit line for determining a data state of the first bit of data; and
transferring the sensed data state of the first data bit to the data buffer.

16. The method for operation of claim 15 wherein the over-drive voltage level is approximately 2.5v.

17. The method for operation of claim 14 wherein programming the floating gates of each of the non-volatile DRAM cells of the selected row of the non-volatile DRAM cells to a program state comprises the steps of:
setting the word line connected to each non-volatile DRAM cell of the selected row of the non-volatile DRAM cells to a large positive programming voltage level,
setting a bit line connected to each non-volatile DRAM cell of the selected row of the non-volatile DRAM cells to a ground reference voltage level,
setting the word line connected to each non-volatile DRAM cell of the selected row of the non-volatile DRAM cells to an intermediate positive programming voltage level such that charges of a first type are injected from the bit line through the drain to a floating gate of the floating gate pass transistor.

18. The method for operation of claim 17 wherein the large positive programming voltage level is approximately 10.0V and the intermediate positive programming voltage level is approximately 5.0V.

19. The method for operation of claim 14 wherein erasing the floating gates of the non-volatile DRAM cells to be erased of the selected row of the non-volatile DRAM cells to the erase state comprises the steps of:
setting the bit line connected to each non-volatile DRAM cell to be erased of the selected row of the non-volatile DRAM cells to an intermediate positive erasing voltage level, and setting the word line connected to each non-volatile DRAM cell of the selected row of the non-volatile DRAM cells to an intermediate negative erasing voltage level such that charges of a second type are injected from the bit line through the drain from the floating gate of the floating gate pass transistor.

20. The method for operation of claim 19 wherein the intermediate positive erasing voltage level is approximately 5.0v and the intermediate negative erasing voltage level is approximately −5.0v.

21. An apparatus for operation of an array of non-volatile DRAM cells
  means for providing a plurality of non-volatile DRAM cells arranged in rows and columns, each non-volatile DRAM cell comprising:
    a capacitor comprising a bottom-plate and a top plate coupled to a common plate node for retaining a first bit of data, and
    an NMOS pass-gate transistor comprising a drain connected to a bit line, a control gate connected to a word line, a source connected to the bottom plate, and a floating gate isolated from and beneath the control gate for retaining a second bit of data;
  means for associating each row of the non-volatile DRAM cells with a tag designator indicating that the first bit of data and the second bit of data are identical or different;
  means for initiating a store transaction for transferring the first data bit from the capacitor to the floating gate of the NMOS pass-gate transistors of the non-volatile DRAM cells of the rows of the non-volatile DRAM cells when the tag designator of a selected row indicates that the first bit of data and the second bit of data are different, wherein means for initiating the store transaction comprises:
    a.) an initialized row counter to selected one row;
    b.) means for activating the means of f.), when the tag designator of a selected row indicates that the first bit of data and the second bit of data are not different;
    c.) means for reading the first bit of data for each non-volatile DRAM cell of the selected row of the non-volatile DRAM cells to a data buffer associated with the column of each of the non-volatile DRAM cells,
    d.) means for programming the floating gates of each of the non-volatile DRAM cells of the selected row of the non-volatile DRAM cells to a program state, and
    e.) means for erasing the floating gates of each of the non-volatile DRAM cells of the selected row of the non-volatile DRAM cells that have the first data bit set to an erase state such that the second data bit is the erase state;
    f.) means for incrementing the row count and sequentially activating the means of b.) through e.) until all rows are completed.

22. The apparatus for operation of claim 21 wherein means for reading the first bit of data to the capacitor of the NMOS pass-gate transistor comprises:
  means for setting the word line to an over-drive voltage level to turn on the NMOS pass-gate transistor and transfer a charge representing the first bit of data from the capacitor; and
  means for sensing a differential voltage between the bit line and a complementary bit line for determining a data state of the first bit of data; and
  means for transferring the sensed data state of the first data bit to the data buffer.

23. The apparatus for operation of claim 22 wherein the over-drive voltage level is approximately 2.5v.

24. The apparatus for operation of claim 21 wherein means for programming the floating gates of each of the non-volatile DRAM cells of the selected row of the non-volatile DRAM cells to a program state comprises:
  means for setting the word line connected to each non-volatile DRAM cell of the selected row of the non-volatile DRAM cells to a large positive programming voltage level,
  means for setting a bit line connected to each non-volatile DRAM cell of the selected row of the non-volatile DRAM cells to a ground reference voltage level,
  means for setting the word line connected to each non-volatile DRAM cell of the selected row of the non-volatile DRAM cells to an intermediate positive programming voltage level such that charges of a first type are injected from the bit line through the drain to a floating gate of the floating gate pass transistor.

25. The apparatus for operation of claim 24 wherein the large positive programming voltage level is approximately 10.0V and the intermediate positive programming voltage level is approximately 5.0V.

26. The apparatus for operation of claim 21 wherein means for erasing the floating gates of the non-volatile DRAM cells to be erased of the selected row of the non-volatile DRAM cells to the erase state comprises:
  means for setting the bit line connected to each non-volatile DRAM cell to be erased of the selected row of the non-volatile DRAM cells to an intermediate positive erasing voltage level, and
  means for setting the word line connected to each non-volatile DRAM cell of the selected row of the non-volatile DRAM cells to an intermediate negative erasing voltage level such that charges of a second type are injected from the bit line through the drain from the floating gate of the floating gate pass transistor.

27. The apparatus for operation of claim 26 wherein the intermediate positive erasing voltage level is approximately 5.0v and the intermediate negative erasing voltage level is approximately −5.0v.

* * * * *

UNITED STATES PATENT AND TRADEMARK OFFICE
CERTIFICATE OF CORRECTION

PATENT NO. : 8,320,190 B2  
APPLICATION NO. : 13/317115  
DATED : November 27, 2012  
INVENTOR(S) : Wingyu Leung Page 1 of 1

It is certified that error appears in the above-identified patent and that said Letters Patent is hereby corrected as shown below:

Title Page in the Inventors Item (75), delete first Inventor "Wingyu Lueng, Saratoga, CA (US)" and replace with -- Wingyu Leung, Saratoga, CA (US) --.

Signed and Sealed this
Twelfth Day of March, 2013

Teresa Stanek Rea
*Acting Director of the United States Patent and Trademark Office*